(12) United States Patent
Chino et al.

(10) Patent No.: US 6,423,561 B1
(45) Date of Patent: Jul. 23, 2002

(54) METHOD FOR FABRICATING SEMICONDUCTOR DEVICE

(75) Inventors: Toyoji Chino, Mino; Takayuki Yoshida, Neyagawa; Kenichi Matsuda, Moriguchi, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/640,280

(22) Filed: Aug. 16, 2000

Related U.S. Application Data

(62) Division of application No. 09/085,545, filed on May 27, 1998, now Pat. No. 6,184,066.

(30) Foreign Application Priority Data

May 28, 1997 (JP) .............................. 9-138903

(51) Int. Cl.[7] .............................................. H01L 21/00
(52) U.S. Cl. ........................................ 438/29; 438/118
(58) Field of Search ................................ 438/455, 107, 438/459, 29, 118, 119, 27, 28, 32, 34

(56) References Cited

U.S. PATENT DOCUMENTS

| | | | |
|---|---|---|---|
| 4,749,120 A | | 6/1988 | Hatada ........................ 228/123 |
| 5,130,531 A | * | 7/1992 | Ito et al. ..................... 250/216 |
| 5,202,754 A | * | 4/1993 | Bertin et al. ................ 257/684 |
| 5,234,153 A | | 8/1993 | Bacon et al. |
| 5,270,261 A | * | 12/1993 | Bertin et al. ................ 438/109 |
| 5,434,426 A | * | 7/1995 | Furuyama et al. ..... 250/214 LS |
| 5,513,204 A | | 4/1996 | Jayaraman |
| 5,517,754 A | * | 5/1996 | Beilstein, Jr. et al. ......... 29/840 |
| 5,622,590 A | | 4/1997 | Kunitomo et al. .......... 156/291 |
| 5,644,667 A | | 7/1997 | Tabuchi ........................ 385/49 |
| 5,675,684 A | | 10/1997 | Hirataka et al. .............. 385/88 |
| 5,774,614 A | | 6/1998 | Gilliland et al. ............. 385/88 |
| 5,796,714 A | | 8/1998 | Chino et al. .................. 372/50 |
| 5,866,953 A | | 2/1999 | Akram et al. ................ 257/790 |
| 5,869,886 A | | 2/1999 | Tokuno ....................... 257/678 |
| 5,925,898 A | * | 7/1999 | Spath .......................... 257/432 |
| 6,194,833 B1 | * | 2/2001 | DeTemple et al. .......... 313/356 |

FOREIGN PATENT DOCUMENTS

| | | |
|---|---|---|
| EP | 0704 947 | 4/1996 |
| EP | 3724 289 | 7/1996 |
| JP | 2-45994 | 2/1990 |

OTHER PUBLICATIONS

K. W. Goossen et al., "GaAs MQW Modulators Integrated with Silicon CMOS", IEEE Photonics Technology Letters, vol. 7, No. 4, Apr. 1995, pp. 360–362.

European Search Report dated May 17, 1999 for EP 98109536.

L. Vanwassenhove et al., "A Room Temerature Flip–Chip Mounting Technique for Laser Diodes on Silicon Motherboards", IEEE Lasers and Electro–Optics Society 1995 Annual Meeting Conference Proceedings San Francisco Oct. 30, 1995, vol. 2, pp. 127–128, Oct. 1995.

S.M. Sze, VLSI Technology, New York: McGraw–Hill, pp. 142–143, 155–157, 602–606, 1988.

Hatada, IEEE Transactions on Computers, Hybrids and Manufacturing Technology, vol. 13(3), pp. 521–527, Sep. 3, 1990.

* cited by examiner

*Primary Examiner*—Olik Chaudhuri
*Assistant Examiner*—Erik Kielin
(74) *Attorney, Agent, or Firm*—Ratner & Prestia

(57) ABSTRACT

A method for fabricating a semiconductor device, in which a semiconductor chip having a first surface and a second surface substantially parallel to each other is mounted on a submount such that the first surface faces the submount, includes: a first step of applying resin to at least one of the semiconductor chip and the submount; a second step of applying a pressure to the semiconductor chip and the submount so that the semiconductor chip and the submount are bonded to each other by the resin, resulting in electrical connection therebetween; and a third step of performing at least one of a film formation process, an etching process, a patterning process, and a washing process for the second surface of the semiconductor chip.

5 Claims, 18 Drawing Sheets

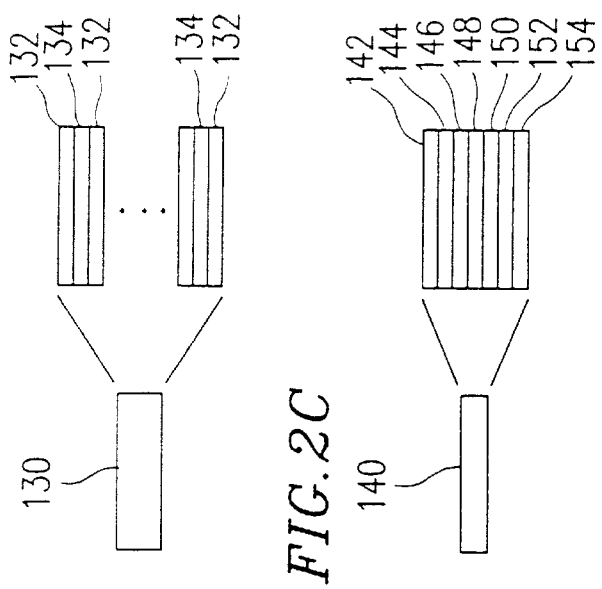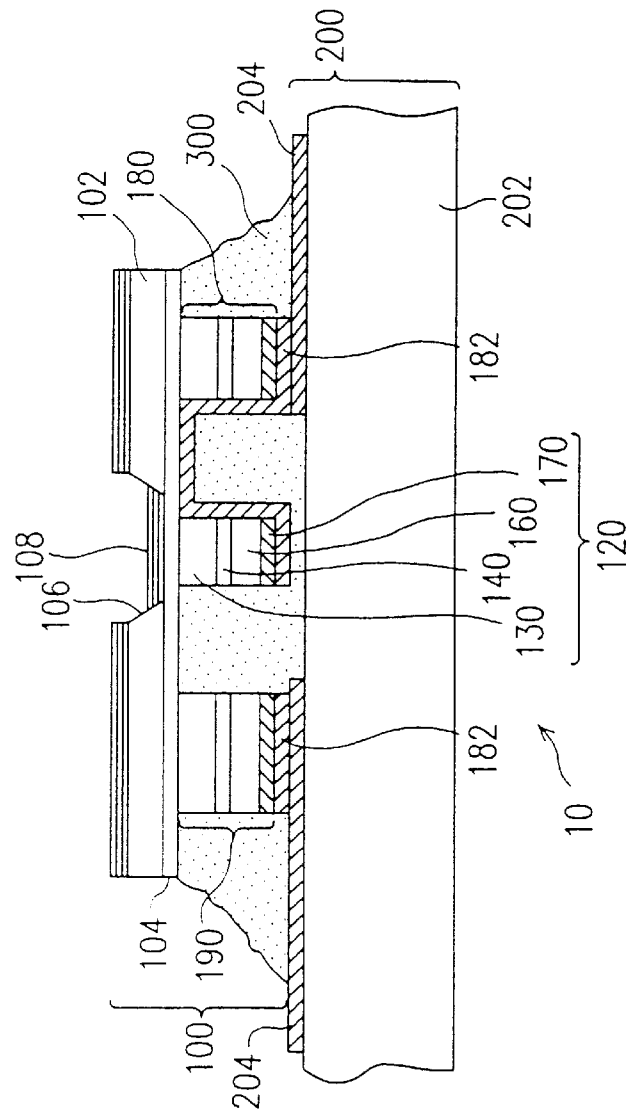

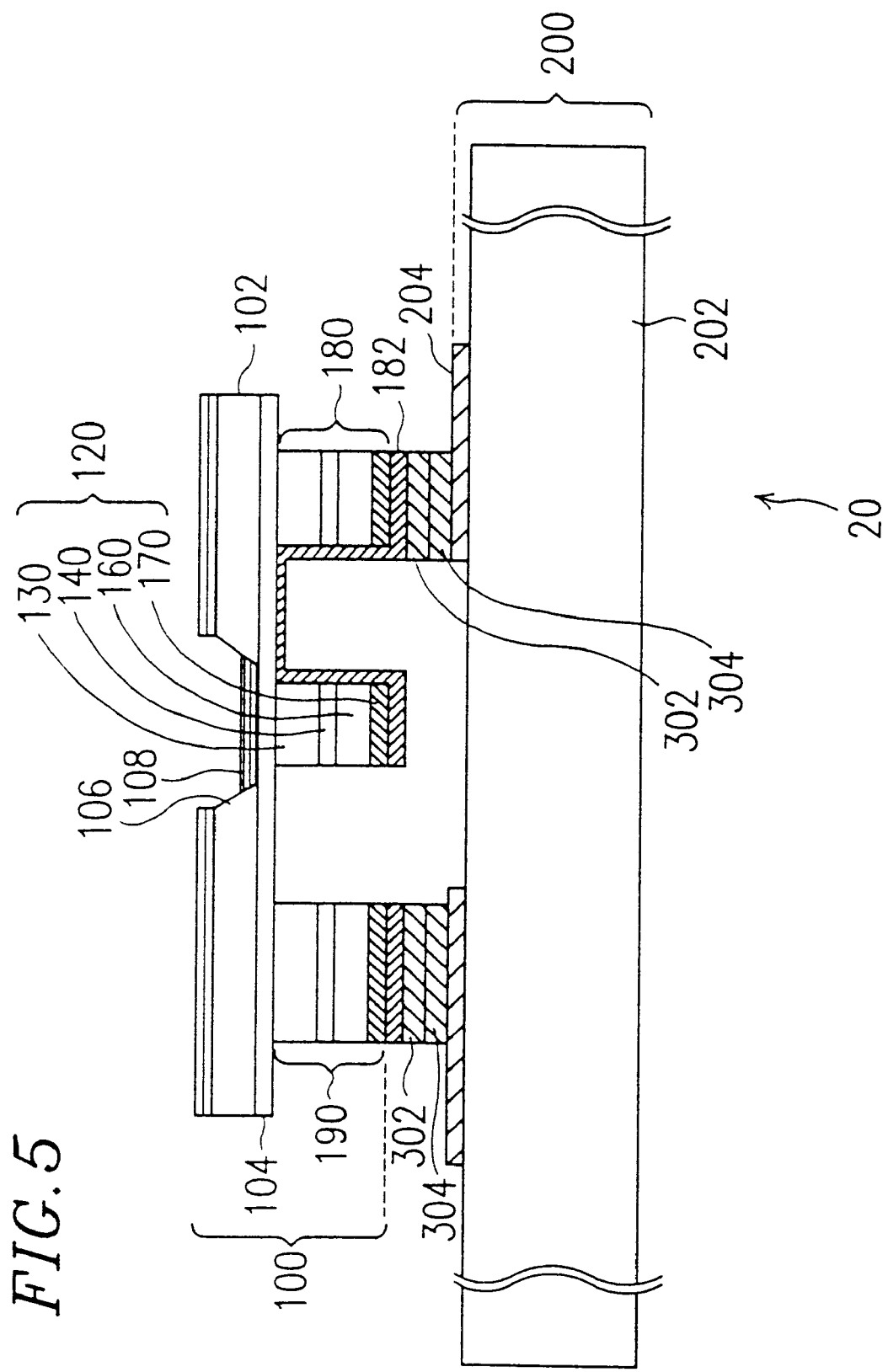

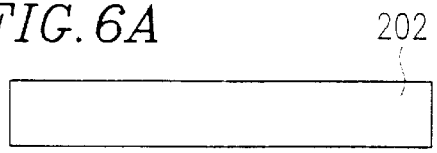
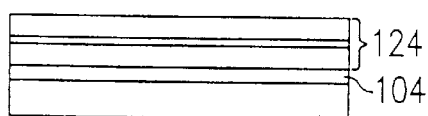
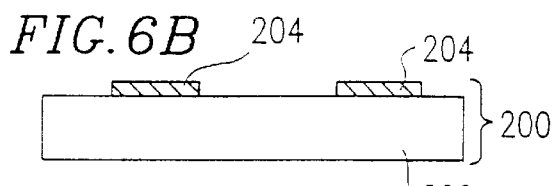
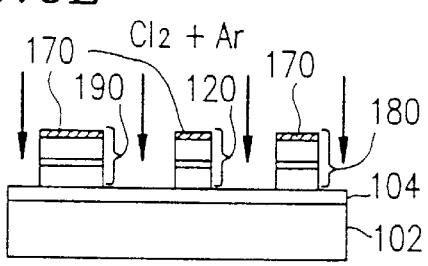
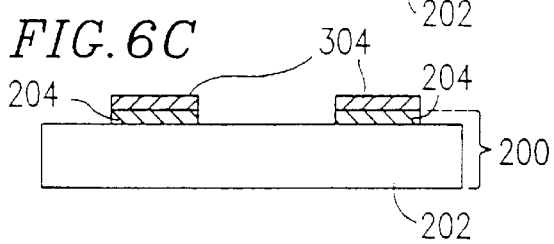
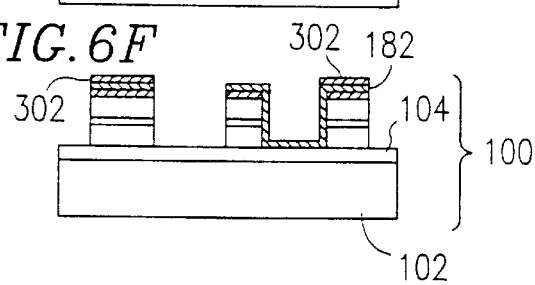
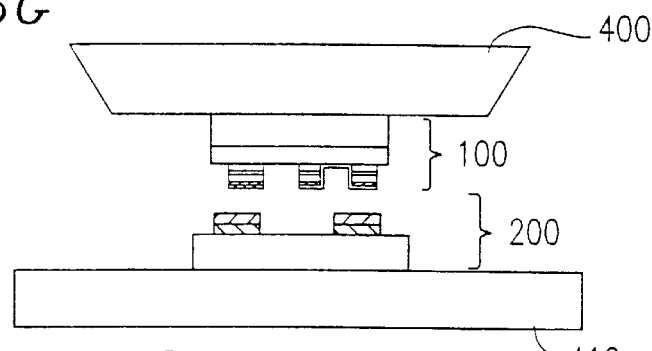
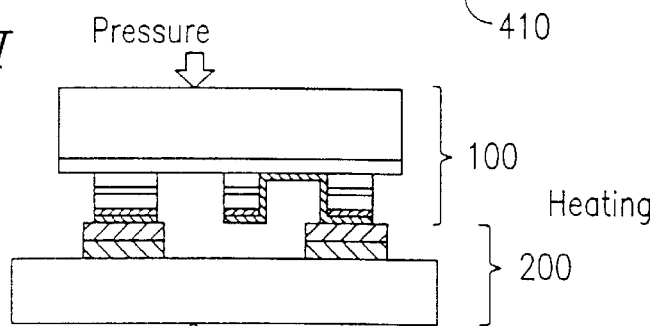
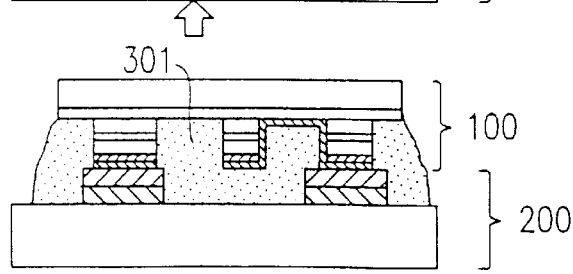

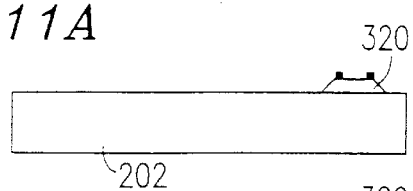
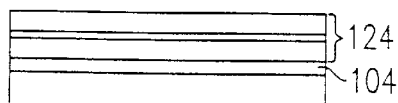
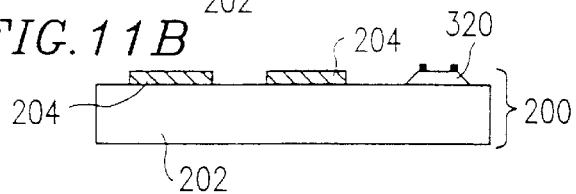
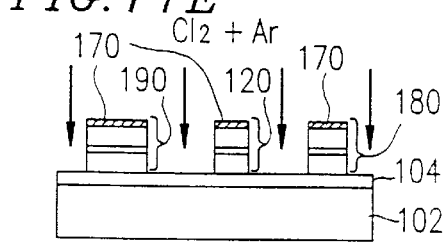
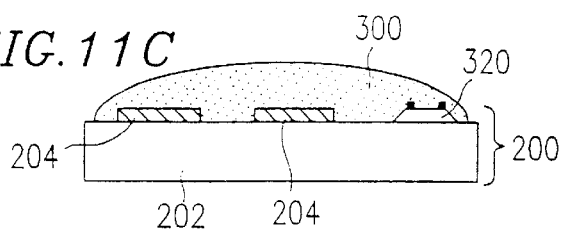
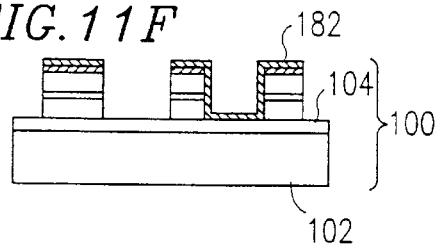
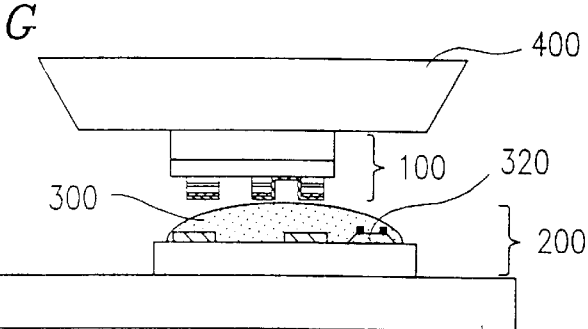
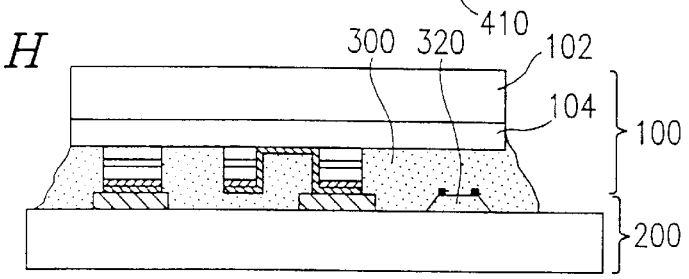
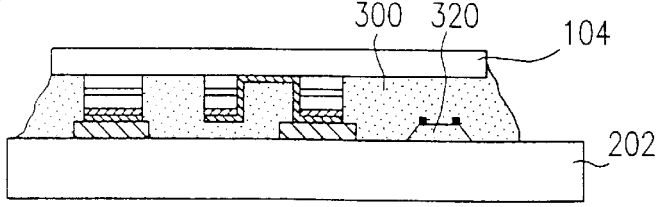

FIG.16A
FIG.16B
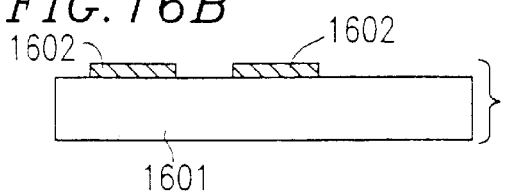
FIG.16C
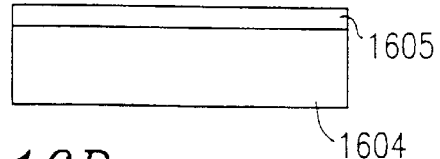
FIG.16D  Cl₂ + Ar
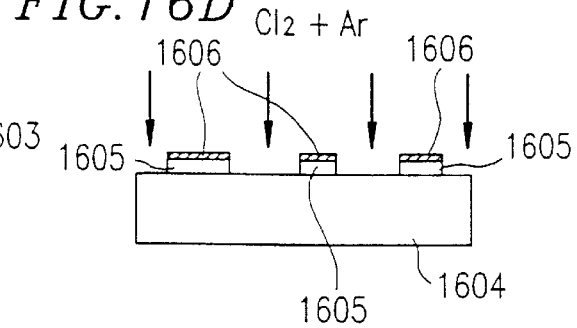
FIG.16E
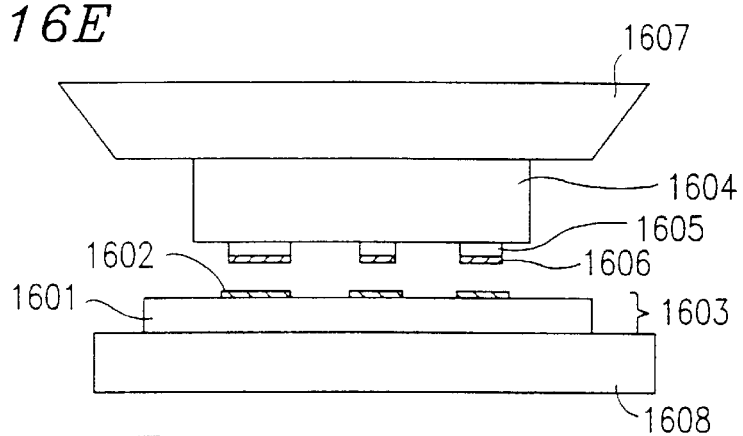
FIG.16F
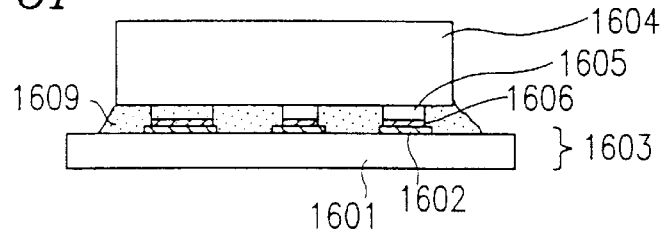
FIG.16G
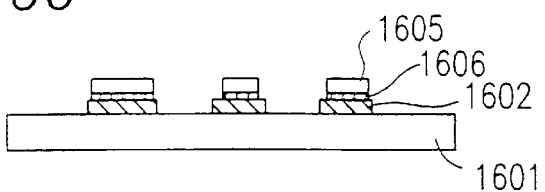

METHOD FOR FABRICATING SEMICONDUCTOR DEVICE

This application is a divisional of U.S. patent application Ser. No. 09/085,545 filed May 27, 1998 now U.S. Pat. No. 6,184,061.

BACKGROUND OF THE INVENTION

1. Field of the Invention

The present invention relates to a method for fabricating a semiconductor device. More particularly, the present invention relates to a method for fabricating a semiconductor device in which a semiconductor chip is processed after the semiconductor chip is mounted on a substrate.

2. Description of the Related Art

One example of a conventional semiconductor device which is structured by mounting a plurality of semiconductor chips on a substrate is described in Photonics Technology Letters, vol. 7, No. 4, pp. 360–362 (1995). According to this conventional technique, several tens of GaAs multi quantum-well light modulators (hereinafter, simply referred to as the "light modulator(s)") are integrated in a hybrid manner on a Si substrate having thereon a previously-formed CMOS transistor. The light modulator is supplied with a bias voltage by the CMOS transistor on the Si substrate, so that a reflectivity changes with respect to input light from the back side of the light modulator. As a result, the intensity of the reflected light is changed. In other words, the light modulator modulates the intensity of the reflected light by modulating the bias voltage, thereby performing signal processing.

FIGS. 18A–18D are cross-sectional views showing steps of a conventional method for fabricating a semiconductor device.

First, as shown in FIG. 18A, Pb/Sn solders 1803 are provided in a predetermined pattern on a CMOS transistor 1805 formed on a Si substrate (not shown) and on a light modulator 1801 formed on a GaAs substrate 1802, respectively.

Next, as shown in FIG. 18B, the Pb/Sn solders 1803 are fused so as to be bonded to each other. Thereafter, as shown in FIG. 18C, epoxy resin 1806 is heated so as to be at about 100° C., thereby reducing its viscosity, and injected between the CMOS transistor 1805 and the light modulator 1801.

Then, as shown in FIG. 18D, the GaAs substrate 1802 is removed by wet etching. Upon performing the wet etching, the epoxy resin 1806 between the CMOS transistor 1805 and the light modulator 1801 serves as a layer for protecting the surface of the light modulator 1801 from an etchant. Finally, an antireflection film (not shown) is deposited on the surface of the light modulator 1801 after the GaAs substrate 1802 has been removed. Thus, the fabrication steps are completed.

According to the above-described conventional technique, the gap between the light modulator 1801 and the CMOS transistor 1805 is filled with the epoxy resin 1806 having a reduced viscosity. For that purpose, it is necessary to precisely control the heating temperature.

Furthermore, in the above conventional technique, voids (i,e., very small bubbles) may be generated in the epoxy resin 1806. Thus, upon performing the wet etching, the surface of the light modulator 1801 may be damaged.

SUMMARY OF THE INVENTION

The present invention provides a method for fabricating a semiconductor device in which a semiconductor chip, having a first surface and a second surface substantially parallel to each other, is mounted on a submount such that the first surface faces the submount. The method includes: a first step of applying resin to at least one of the semiconductor chip and the submount; a second step of applying a pressure to the semiconductor chip and the submount so that the semiconductor chip and the submount are bonded to each other by the resin, resulting in electrical connection therebetween; and a third step of performing at least one of a film formation process, an etching process, a patterning process, and a washing process for the second surface of the semiconductor chip.

A step of inspecting operational characteristics of the semiconductor chip may be further performed between the second step and the third step.

Another semiconductor element may be formed on the second surface of the semiconductor chip in the third step.

The method may further include, after the third step: a fourth step of removing an oxide film generated on the second surface; and a fifth step of performing an atomic layer bonding of another semiconductor chip onto the second surface of the semiconductor chip. In that case, another semiconductor element may be formed on the second surface of the semiconductor chip in the fifth step.

The method may further include a step of disposing a plurality of the semiconductor chips on the submount substantially at the same time.

The method may further include the steps of: forming a region of a metal having a low melting point on at least one of the first surface of the semiconductor chip and the submount; and heating the metal to a temperature close to the melting point thereof.

Thus, the invention described herein makes possible the advantage of providing a method for fabricating a semiconductor device which is capable of efficiently processing the back surface of a semiconductor chip.

This and other advantages of the present invention will become apparent to those skilled in the art upon reading and understanding the following detailed description with reference to the accompanying figures.

BRIEF DESCRIPTION OF THE DRAWINGS

FIGS. 2A–2C are cross-sectional views showing one of surface emitting laser chips included in the semiconductor device of FIG. 1 fabricated according to the method in Embodiment 1 of the present invention;

FIG. 5 is a cross-sectional view showing one of surface emitting laser chips included in a semiconductor device fabricated according to a method in Embodiment 2 of the present invention;

FIGS. 6A–6I are views for illustrating steps in the method for fabricating a semiconductor device according to Embodiment 2 of the present invention;

FIGS. 11A–11I are views for illustrating steps in a method for fabricating a semiconductor device according to Embodiment 5 of the present invention;

FIGS. 16A–16G are views for illustrating steps in a method for fabricating a semiconductor device according to Embodiment 8 of the present invention;

DESCRIPTION OF THE PREFERRED EMBODIMENTS

Figure 1:
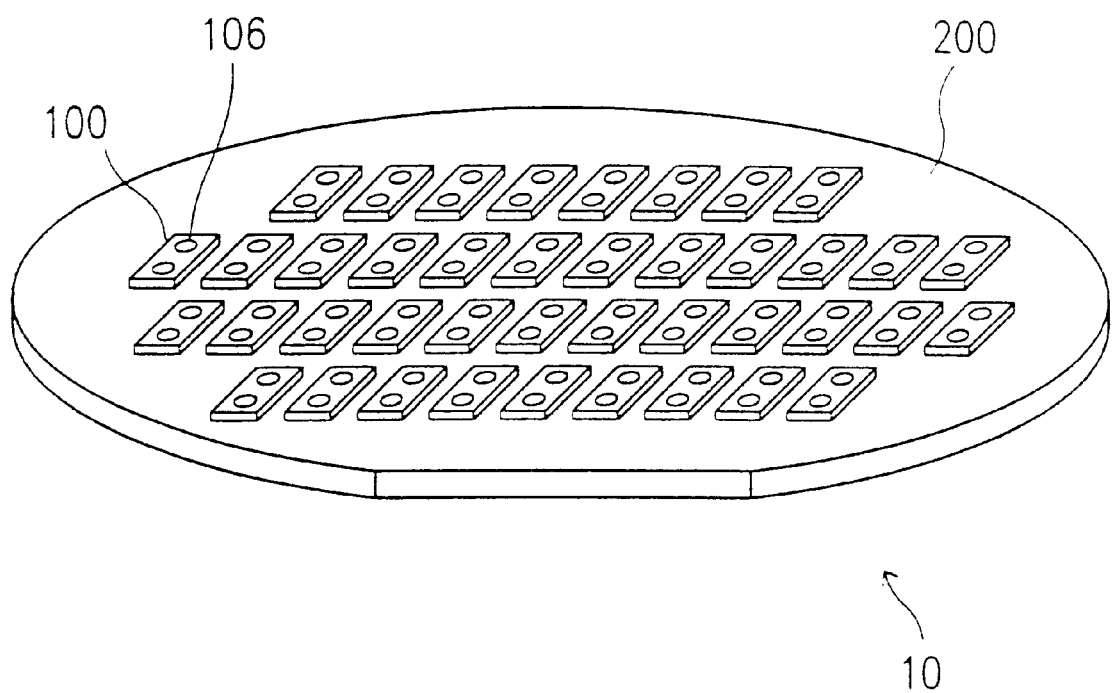
FIG. 1 is a general view showing a semiconductor device fabricated according to a method in Embodiment 1 of the present invention.

The entire disclosure of U.S. patent application Ser. No. 09/085,545 filed May 27, 1998 now U.S. Pat. No. 6,184,066 is expressly incorporated by reference herein.

Hereinafter, the present invention will be described by way of illustrative, but non-limiting examples with reference to the accompanying drawings. The same reference numeral in the drawings denotes the same component.

Embodiment 1

First, with reference to FIGS. 1 and 2A–2C, the structure of a semiconductor device fabricated according to a method in Embodiment 1 of the present invention will be described.

FIG. 1 is a general view of a semiconductor device 10 fabricated according to the method in Embodiment 1 of the present invention.

Specifically, several tens of surface emitting laser chips 100 are mounted on a Si submount 200. Each of the surface emitting laser chips 100 has two surfaces substantially parallel to each other. One of the two surfaces of the surface emitting laser chip 100 (which may be referred to as the "front surface") is in contact with the surface of the Si submount 200. The "back surface" of the surface emitting laser chip 100 herein refers to the other surface of these two surfaces, which is not in contact with the Si submount 200.

As will be described later in detail, when a large number of chips 100 are mounted on a single submount 200 with a large diameter as shown in FIG. 1 and certain processing steps are then performed simultaneously for the mounted chips 100, the required number of processing steps, which otherwise would correspond to the number of chips to be processed in the conventional technique, can be remarkably reduced. Moreover, the scribing process for the Si submount 200 to be performed after simultaneously processing the back surfaces of the surface emitting laser chips 100 significantly contributes to the simplification of the production steps.

On the back surface of the respective surface emitting laser chips 100, back surface guide holes 106 through which a laser beam emitted from a surface emitting laser travels (hereinafter, simply referred to as the "guide holes 106") are provided. The guide holes 106 prevent the generated laser beam from being absorbed or scattered by the GaAs substrate on which the surface emitting laser chips 100 are formed. Moreover, the guide hole 106 is formed in a concentric manner with the surface emitting laser formed on the front surface of the GaAs substrate. Therefore, when an optical fiber is to be coupled with the surface emitting laser, the guide hole 106 enables the alignment therebetween to be easily performed. The guide holes 106 are formed on the back surface of the surface emitting laser chip 100 after the surface emitting laser chip 100 is mounted on the Si submount 200.

A surface emitting laser to be described later is formed on the GaAs substrate so as to have an outer rim substantially in a circle. A diameter of the circle is, for example, in the range of about 5 $\mu$m to about 50 $\mu$m. A diameter of the guide hole 106 is typically set to be at about 130 $\mu$m, since a diameter of the optical fiber to be inserted into the guide hole 106 is typically about 125 $\mu$m with a margin of 5 $\mu$m.

FIGS. 2A–2C are cross-sectional views explaining one of the surface emitting laser chips 100 included in the semiconductor device 10 fabricated according to the method in Embodiment 1 of the present invention.

Wirings 204 are formed in a predetermined pattern on a Si substrate 202 of the Si submount 200. The wirings 204 may be formed of, for example, a Au layer, or a plurality of metal layers including a Au layer. However, the material constituting the wirings 204 is not limited thereto. As will be described later, the surface emitting laser chip 100 is mounted on the Si submount 200 by flip chip mounting technique.

The surface emitting laser chip 100 includes the GaAs substrate 102 and the surface emitting laser 120 provided on the GaAs substrate 102. The surface emitting laser 120 includes: a p-type Bragg reflector 130 provided on the GaAs substrate 102 via an etching stop layer 104; an active layer 140; an n-type Bragg reflector-160; and an electrode 170. The p-type Bragg reflector 130 is structured, as shown in FIG. 2B, by laminating 24.5 pairs of a p-AlAs layer 132 and a p-GaAs layer 134. The n-type Bragg reflector 160 has the same structure as that of the p-type Bragg reflector 130, except that it has the n-type conductivity.

The active layer 140 includes, as shown in FIG. 2C: an n-AlGaAs layer 142; an AlGaAs layer 144; a GaAs layer 146; an InGaAs layer 148; a GaAs layer 150; an. AlGaAs layer 152; and a p-AlGaAs layer 154. Light generated in the active layer 140 is confined by the p-type Bragg reflector 130 and the n-type Bragg reflector 160, thereby causing laser oscillation.

The structure of the surface emitting laser 120 is not limited to the one which includes the p-type Bragg reflector 130 in the above-described manner, the active layer 140 and the n-type Bragg reflector 160. The present invention can be applied to any surface emitting laser having at least an active layer and two reflectors interposing the active layer therebetween.

Referring back to FIG. 2A, a microbump 180 and a common anode microbump 190 are also formed on the GaAs substrate 102 so that the surface emitting laser 120 does not directly contact the Si substrate 202 upon performing the flip chip mounting. More specifically, a distance between the surface emitting laser 120 and the Si substrate 202 substantially equals the thickness of the wirings 204, which is, for example, in the range of about 0.5 µm to about 3 µm.

The surface emitting laser 120 is electrically connected to the microbump 180 via a Ti/Au wiring 182. The Ti/Au wiring 182 may have a two-layered structure including a Ti layer and a Au layer, since it requires a certain level of mechanical strength and a low electrical resistance. However, the material constituting the wiring 182 is not limited thereto. Alternative materials for the Ti/Au wiring 182 include, for example, Ti, Au, Pt/Au, Ti/Pt, the combination thereof, and a TiN alloy.

A portion of the GaAs substrate 102, at a position facing the surface emitting laser 120, is removed such that the guide hole 106 is formed in a concentric manner with the surface emitting laser 120. The antireflection film 108 is then deposited on an emission portion for the laser beam (i.e., in the guide hole 106) and on the GaAs substrate 102. The guide hole 106 utilizes the etching stop layer 104 as its bottom surface. By forming the guide hole 106, absorption and scattering of the laser beam by the GaAs substrate 102 are eliminated, as set forth previously. In addition, the guide hole 106 can function as a guiding mechanism when the optical fiber is to be coupled with the surface emitting laser 120, realizing an easy coupling.

Each side surface of the guide hole 106 preferably has a shape of an inverted truncated cone. An angle formed by the generating line of the inverted truncated cone and the GaAs substrate 102 is preferably in the range of about 70° to about 85°. Alternatively, the shape of the guide hole 106 may be cylindrical.

The space between the surface emitting laser chip 100 and the Si submount 200 is substantially filled with a UV curable resin 300. As a result, the UV curable resin 300 prevents the surface of the surface emitting laser 120 from contacting the air. Accordingly, deterioration in the characteristics of the surface emitting laser 120 over time can be prevented.

Next, a method for fabricating a semiconductor device according to the present invention will be described. FIGS. 3A–3I and 4A–4C are views for illustrating steps of the method for fabricating a semiconductor device according to Embodiment 1 of the present invention, following the order of the illustration from FIG. 3A to FIG. 4C.

Figure 3A:
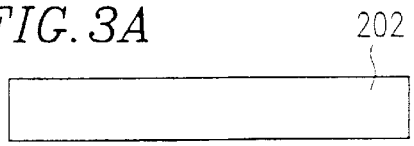
FIGS. 3A–3I are views for illustrating steps in the method for fabricating a semiconductor device according to Embodiment 1 of the present invention.

First, in FIG. 3A, the Si substrate 202 is pretreated in which the Si substrate 202 is typically washed with water or organic solvent.

Figure 3B:
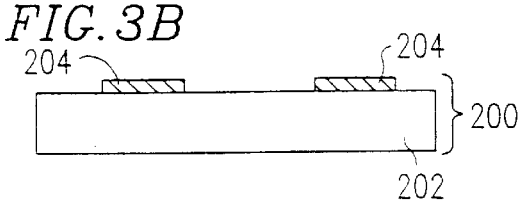

Then, in FIG. 3B, the wirings 204 formed of a Au layer, or a plurality of metal layers including Au, are provided in a predetermined pattern on the pretreated Si substrate 202, thereby forming the Si submount 200. The wirings 204 are intended to electrically connect the microbump 180 in the surface emitting laser chip 100 with a pad (not shown) on the Si submount 200. Prior to the sealing of the semiconductor device 10 in a package, the pad and a connecting pin are electrically connected to each other by wire bonding.

The Si submount 200 including the wirings 204 formed thereon is then washed with water and dried, so as to remove a foreign material on the surface of the Si submount 200. In the case where the attached material is an organic material, the Si submount 200 may be washed with organic solvent instead of water.

Figure 3C:
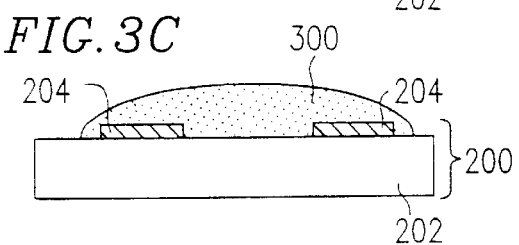

Thereafter, in FIG. 3C, the UV curable resin 300 in a liquid form is applied to the Si submount 200. The "application" herein means adhesion of the UV curable resin 300 in such a manner that the desired area on the Si submount 200 is covered therewith. Thus, the "application" in the present specification includes the adhesion by spraying, dropping, or the like.

Figure 3D:
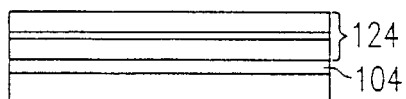

On the other hand, in order to obtain the surface emitting laser chip 100, in the step shown in FIG. 3D, the etching stop layer 104 and crystal growth layers 124 are formed on the GaAs substrate 102 in this order using, e.g., a molecular beam epitaxy (MBE) method or a metal organic vapor phase epitaxy (MOVPE) method.

Figure 3E:
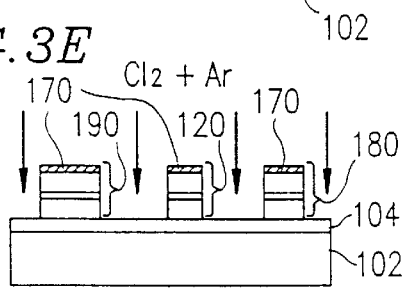

Subsequently in FIG. 3E, the electrodes 170 in a predetermined array pattern are formed on the crystal growth layers 124. The surface emitting laser 120, the microbump 180, and the common anode microbump 190 are then formed by dry-etching the crystal growth layers 124 with a mixed gas of chlorine and argon using the electrodes 170 as masks. Although the microbump 180 and the common anode microbump 190 are preferably provided with dry etching, the method is not limited thereto. For example, wet etching using a mixed solution of sulfuric acid, hydrogen peroxide solution and water may be employed.

Figure 3F:
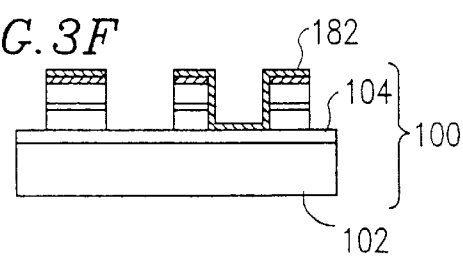

In FIG. 3F, the surface emitting laser 120 and the microbump 180 are electrically connected to each other using the Ti/Au wiring 182, thereby completing the surface emitting laser chip 100. Next, the surface emitting laser chip 100 is washed with water and then dried, so as to remove foreign material on the surface thereof. In the case where the attached material is an organic material, the surface emitting laser chip 100 may be washed with organic solvent instead of water.

Figure 3G:
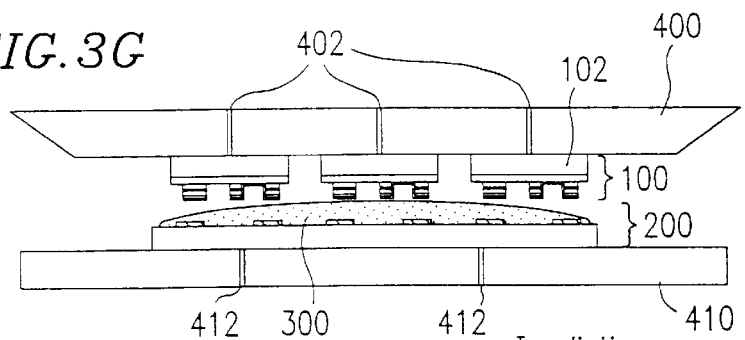

Then, in FIG. 3G, one of, or preferably a plurality of, the surface emitting laser chips 100 are disposed so as to face the Si submount 200, and alignment therebetween is performed. Specifically, the surface emitting laser chips 100 are fixed on an adsorption tool 400 having inlets 402 in such a manner that the back surface of the respective chips 100 is vacuum-adsorbed to the tool 400. On the other hand, the Si submount 200 onto which the UV curable resin 300 is dropped is fixed on an adsorption seating 410 having inlets 412 by vacuum adsorption. The inlets 402 and 412 are in communication with a vacuum pump (not shown), and adsorb the surface emitting laser chip 100 and the Si submount 200, respectively, by negative pressure. In the subsequent drawings, however, the inlets 402 and 412 are not shown for the purpose of simplification.

The area of the adsorption tool 400 is typically greater than the area of the respective surface emitting laser chips 100, so that a plurality of the surface emitting laser chips 100 can be adsorbed onto the single adsorption tool 400, whereas the Si submount 200 with the wirings 204 corresponding to the plurality of the surface emitting laser chips 100 is adsorbed onto the adsorption seating 410. For the purpose of improving throughput of the fabrication process, the number of the surface emitting laser chips 100 to be adsorbed onto the adsorption tool 400 is preferably about 10 or greater. Alternatively, the number of the surface emitting laser chips 100 may be one.

Figure 3H:
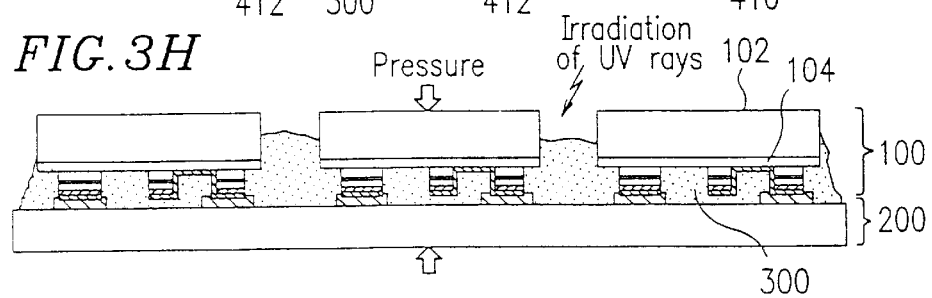

Subsequently in FIG. 3H, the surface emitting laser chips 100 and the Si submount 200 are irradiated with UV rays while being applied with pressures in directions perpendicular to the surface emitting laser chips 100 and the Si submount 200, respectively. It should be noted in FIGS. 3H and 3I, the adsorption tool 400 and the adsorption seating 410 are not shown for the purpose of simplification.

In order to apply pressure, for example, the adsorption tool 400 may be pressed against the adsorption seating 410. By this pressure application, the resin 300 which is present between the microbump 180 and the wirings 204 as well as between the cathode microbump 190 and the wirings 204 is extruded therefrom. As a result, the surface emitting laser chips 100 and the Si submount 200 are electrically connected to each other, and the UV curable resin 300 fills the space between the laser chips 100 and the submount 200 so as to substantially cover the surface of the surface emitting laser chips 100 opposing to the Si submount 200.

In order to realize the electrical connection and the filling of the UV curable resin 300, the pressure preferably in the range of about $3 \times 10^4$ N/m$^2$ to about $2 \times 10^6$ N/m$^2$, and more preferably in the range of about $5 \times 10^4$ N/m$^2$ to about $7 \times 10^4$ N/m$^2$, is applied. The pressure is typically applied for a period of about 20 seconds to about 10 minutes. By curing the UV curable resin 300 through the irradiation of the UV rays, the surface emitting laser chips 100 and the Si submount 200 are bonded to each other, as shown in FIG. 3H.

Figure 3I:
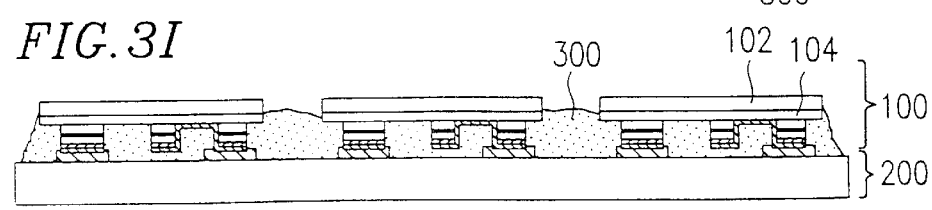

Then in FIG. 3I, the GaAs substrate 102 in the surface emitting laser chip 100 is etched away with a mixed solution of sulfuric acid, hydrogen peroxide and water. The etching is stopped when a remaining thickness of the GaAs substrate 102 becomes about 15 $\mu$m.

Figure 4A:
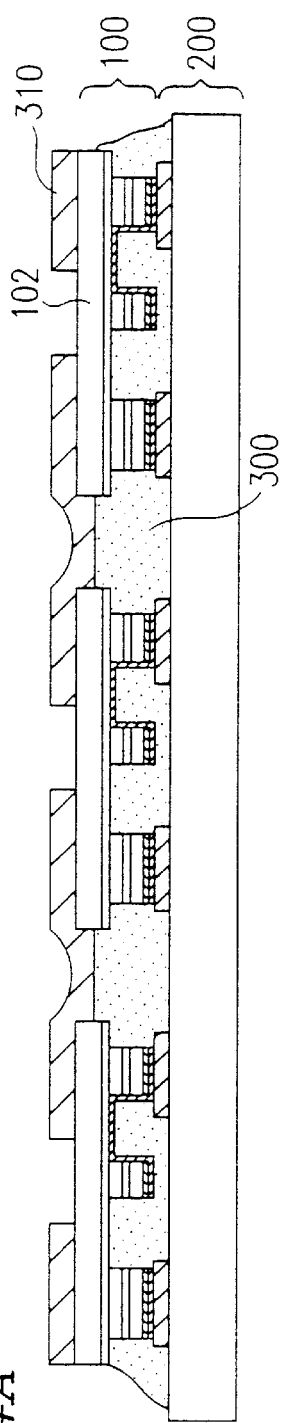
FIGS. 4A–4C are views for illustrating steps in the method for fabricating a semiconductor device according to Embodiment 1 of the present invention.

Before performing the subsequent step shown in FIG. 4A, it is preferable to inspect the operational characteristics of the mounted surface emitting laser chips 100. Typically, the inspection is performed by operating the surface emitting laser 120 to emit light while a probe of a tester (i.e., a characteristics inspection apparatus) is allowed to stand on the wiring on the Si submount 200 electrically connected to the microbump 180 or the cathode microbump 190, or on an inspection pad (not shown). The light emitting condition of the surface emitting laser 120 is monitored by a photodetector (not shown). In the above-described characteristics inspection, in addition to the light emission characteristics, direct current characteristics are typically inspected.

According to the method of the present invention, the operational characteristics of the surface emitting laser 120 can be checked with the surface emitting laser chip 100 mounted on the Si submount 200. The surface emitting laser chip 100 which is determined to include the surface emitting laser 120 failing to exhibit a desired characteristics as a result of this inspection process is eliminated from the subsequent fabrication process after the step in FIG. 4C.

Referring to the step shown in FIG. 4A to be conducted after the step shown in FIG. 3I, a SiO$_2$ film 310 is deposited on the back surfaces of the surface emitting laser chips 100. Thereafter, the SiO$_2$ film 310 is processed in a predetermined pattern with the process using normal photoresist.

Figure 4B:
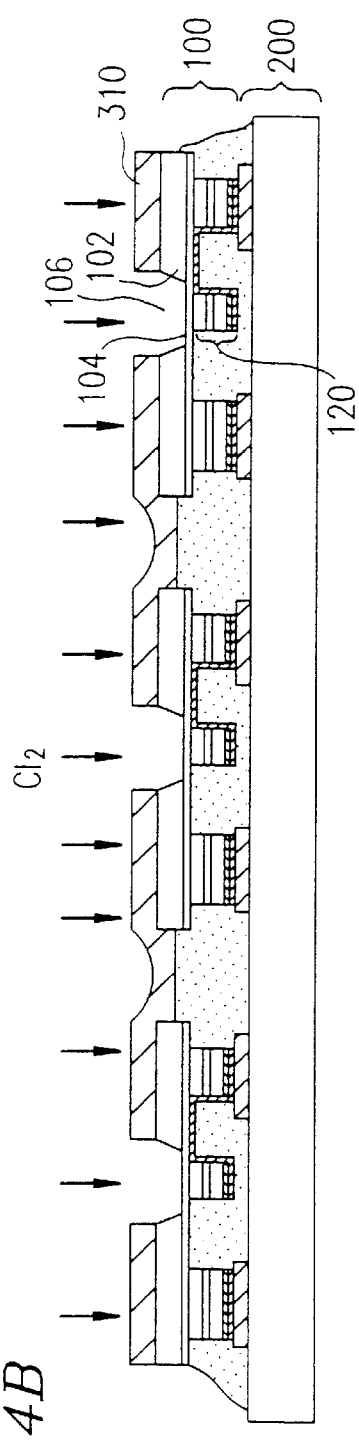

Then in FIG. 4B, the GaAs substrate 102 with a thickness of about 15 $\mu$m is etched by reactive ion beam etching with chlorine gas, using the SiO$_2$ film 310 as a mask. The reactive ion beam etching is stopped at the etching stop layer 104. As a result, the guide hole 106 is formed on the back surface of the etching stop layer 104 opposing to the surface emitting laser 120.

Figure 4C:
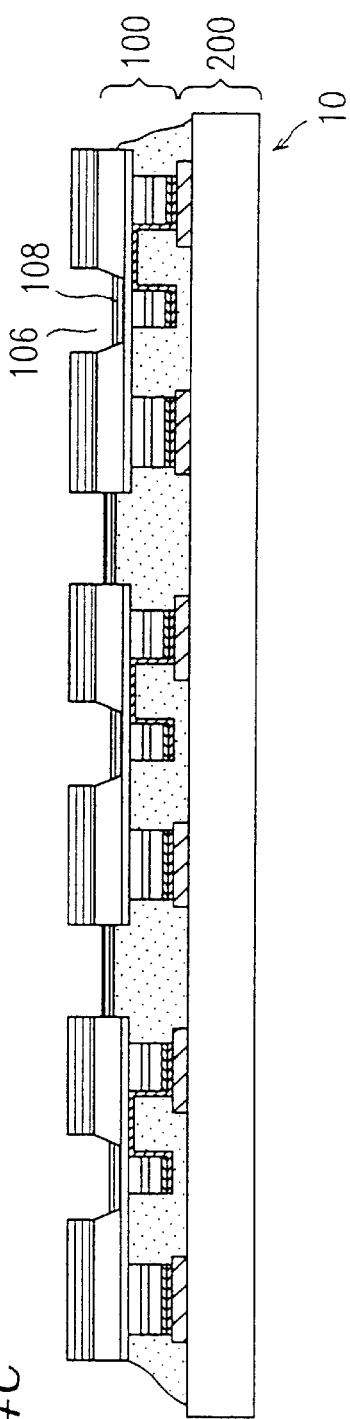

Thereafter in FIG. 4C, the antireflection film 108 is deposited on the back surface of the surface emitting laser chip 100. The antireflection film 108 is provided in order to efficiently emit the laser beam from the surface emitting laser 120.

After the step of FIG. 4C, the Si submount 200 on which the integrated surface emitting laser chip 100 is mounted is divided into pieces along the scribe lines. In the case where a semiconductor device having a plurality of surface emitting laser chips 100 is fabricated, the Si submount 200 including the plurality of surface emitting laser chips 100 is obtained as a single chip. In the case where a semiconductor device having a single surface emitting laser chip 100 is fabricated, the Si submount 200 including the single surface emitting laser chip 100 is obtained as a single chip.

Among the divided chips, a non-defective chip is mounted onto a package and electrically connected to an external pin by a metal wire. Finally, the package is sealed.

In the thus fabricated surface emitting laser chip 100, heat releasing property is improved due to the Si submount 200, and reliability is also increased since the surface thereof is covered so as to be isolated from the air. Moreover, the guide hole 106 prevents the output light from being absorbed or scattered by the substrate, and further facilitates the coupling between the optical fiber and the surface emitting laser 120.

According to the present embodiment, etching is performed in the step of FIG. 3I; patterning is performed in the step of FIG. 4A; and etching is performed in the step of FIG. 4B. However, the present invention is not limited thereto. The advantages of the present invention can be obtained when at least any one of the film formation process, the etching process, the patterning process, and the washing process is performed with respect to the back surface which is opposite to the surface of the surface emitting laser chip 100 facing the Si submount 200.

The "film formation", the "etching", the "patterning", and the "washing" used in this specification are defined as follows.

The "film formation" may typically mean a film deposition by MBE or MOVPE, but is not limited thereto.

By the film formation, a dielectric film, an oxide film, or an antireflection film, for example, is formed.

The "etching" herein includes the step of removing the entire film(s) formed on a wafer, and the step of selectively removing a portion excluding an area covered with a resist pattern formed typically by lithography technique. The etching herein includes wet etching by chemicals (e.g., an acid) and dry etching performed in a gas.

The "patterning" herein includes the step of using a designed circuit pattern as a mask and the resist step where the mask pattern is transferred onto the wafer.

The "washing" typically means the step of removing foreign material on a surface with water. In particular, if the foreign material to be removed is an organic material, the washing may be performed with organic solvent. Moreover, drying step may be performed along with the washing.

According to the method for fabricating a semiconductor device 10 of this invention, after performing a microbump bonding (hereinafter, simply referred to as a "MBB") process typically including the steps shown in FIGS. 3A–3H, at least one of the film formation process, the etching process, the patterning process, and the washing process is performed for the back surface which is opposite to the surface of the surface emitting laser chip 100 facing the Si submount 200. In this manner, the back surfaces of the large number (for example, in the order of about 100 to about 1000) of the semiconductor chips are simultaneously processed. As a result, uniform operational characteristics, increased fabrication yield, and lower fabrication cost can be realized. Moreover, when the back surfaces of the semiconductor chips are treated, it is only necessary to fix the submount on which the semiconductor chips are mounted, rather than the semiconductor chip itself. Thus, alignment accuracy required in the production system is significantly relaxed, thereby realizing more efficient production.

Although the plurality of the surface emitting laser chips 100 are formed on the submount 200 in the present embodiment, the present invention is not limited thereto. For example, a plurality of field effect transistors, MOS transistors, or bipolar transistors may be formed.

Moreover, the material for the submount is typically Si, but not limited thereto. A substrate made of glass, AlN, $Al_2O_3$, or the like, as well as a Si substrate with a $SiO_2$ layer formed thereon, may be employed as the submount.

Embodiment 2

FIG. 5 is a cross-sectional view showing one of surface emitting laser chips 100 included in a semiconductor device 20 fabricated according to the method in Embodiment 2 of the present invention.

The semiconductor device 20 has the same structure as that of the semiconductor device 10 in Embodiment 1, except that the surface emitting laser chip 100 and the Si submount 200 are bonded to each other by fusion of microbumps 302 and 304, and the UV curable resin 300 is not employed. Like components are designated with like reference numerals, and the descriptions thereof will be omitted herein.

The method for fabricating the semiconductor device 20 according to the present invention will be described. FIGS. 6A–6I and 7A–7C are views for illustrating steps in the method for fabricating a semiconductor device according to Embodiment 2 of the present invention.

Figure 7A:
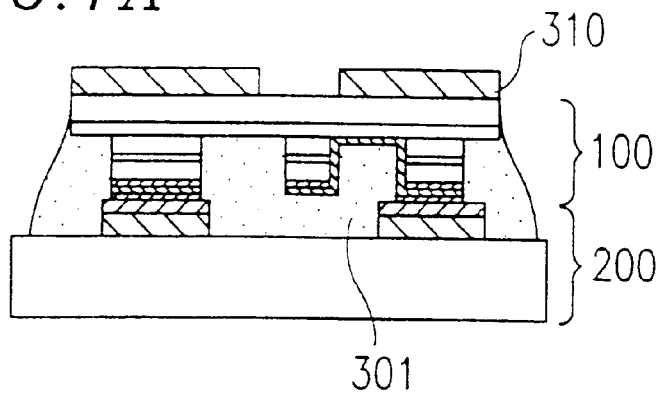
FIGS. 7A–7C are views for illustrating steps in the method for fabricating a semiconductor device according to Embodiment 2 of the present invention.
Figure 7B:
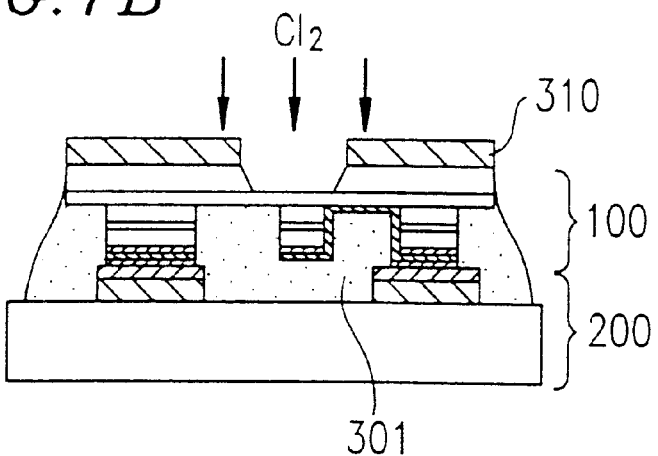
Figure 7C:
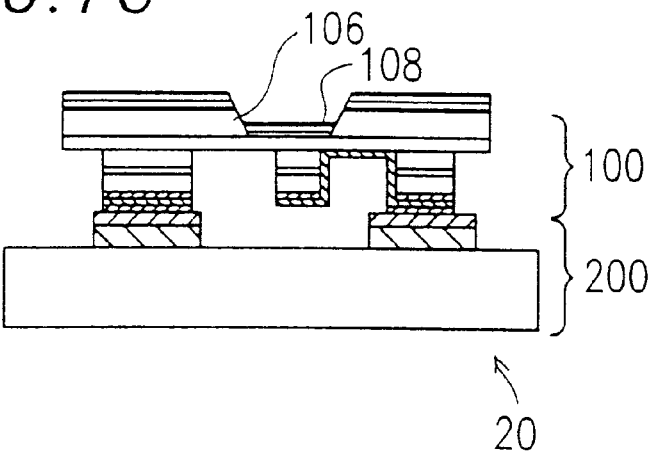

The steps shown in FIGS. 6A–6I and the steps shown in FIGS. 7A–7C basically correspond to the steps shown in FIGS. 3A–3I and the steps shown in FIGS. 4A–4C, respectively. Thus, points different from Embodiment 1 explained previously with reference to FIGS. 3A–3I and 4A–4C will be mainly described hereinafter. The description for the steps similar to the previously-explained steps will be omitted.

In the step shown in FIG. 6C, the microbumps 304 are formed on the wirings 204. In the step shown in FIG. 6F, the microbump 302 is formed on the Ti/Au wiring 182. Bismuth (Bi) may be used as a material for the microbumps 302 and 304 in Embodiment 2, but is not limited thereto. Any metal capable of fusing at such a sufficiently low temperature that a semiconductor device to be formed on the GaAs substrate 102 is not adversely affected can be used for forming the microbumps 302 and 304. Taking this into consideration, a metal with a low melting point of about 200° C. or lower is preferably used. For example, a microbump employing indium (In) may be used.

When either of these metals is used as a material for the microbumps 302 and 304, in the step of FIG. 6H, it is sufficient to perform the heating until obtaining a temperature at which the material used is fused. Moreover, the microbump employing Bi or In may be disposed either on the surface emitting laser chip or on the Si submount, or on both of them.

In Embodiment 1, the UV curable resin 300 is employed and irradiated with the UV rays so that the surface emitting laser chip 100 and the Si submount 200 are bonded to each other. In Embodiment 2, the microbump 302 and the microbump 304 are heated so as to be fused and bonded to each other without use of the UV curable resin in the step of FIG. 6H.

More specifically, the surface emitting laser chip 100 and the Si submount 200 are heated while being applied with pressures in directions perpendicular to the surface emitting laser chip 100 and the Si submount 200, respectively. The heating is performed under such conditions of temperature and time that the microbump 302 and the microbump 304 are fused. Typically, in Embodiment 2, the microbump 302 and the microbump 304 are fused and electrically connected to each other when heated at a temperature of about 150° C. for about five minutes with a pressure of about $3 \times 10^4$ $N/m^2$. In order to realize satisfactory electric conduction between the microbump 302 and the microbump 304, it is preferable to satisfy the following conditions:

Pressure: about $3 \times 10^4$ $N/m^2$ to about $7 \times 10^6$ $N/m^2$;

Temperature: about 130° C. to about 200° C.; and

Heating time: about 20 seconds to about 10 minutes.

In the step of FIG. 6I, in order to protect respectively opposing surfaces of the surface emitting laser chip 100 and the Si submount 200, resist 301 is applied to those surfaces. Since the resist 301 is not intended to be used for bonding the surface emitting laser chip 100 and the Si submount 200 to each other, the resist 301 is not necessarily a UV curable resin.

In the step of FIG. 7C, the resist 301 is typically removed using acetone. In order to fill the space occupied by the resist 301 after the removal thereof and to protect the semiconductor device 20, polyimide (not shown), for example, may be injected into the space.

In Embodiment 2 of the present invention, as in Embodiment 1, at least one of the film formation process, the etching process, the patterning process, and the washing process can be simultaneously performed for the back surfaces of the large number of the surface emitting laser chips 100.

Embodiment 3

Figure 8:
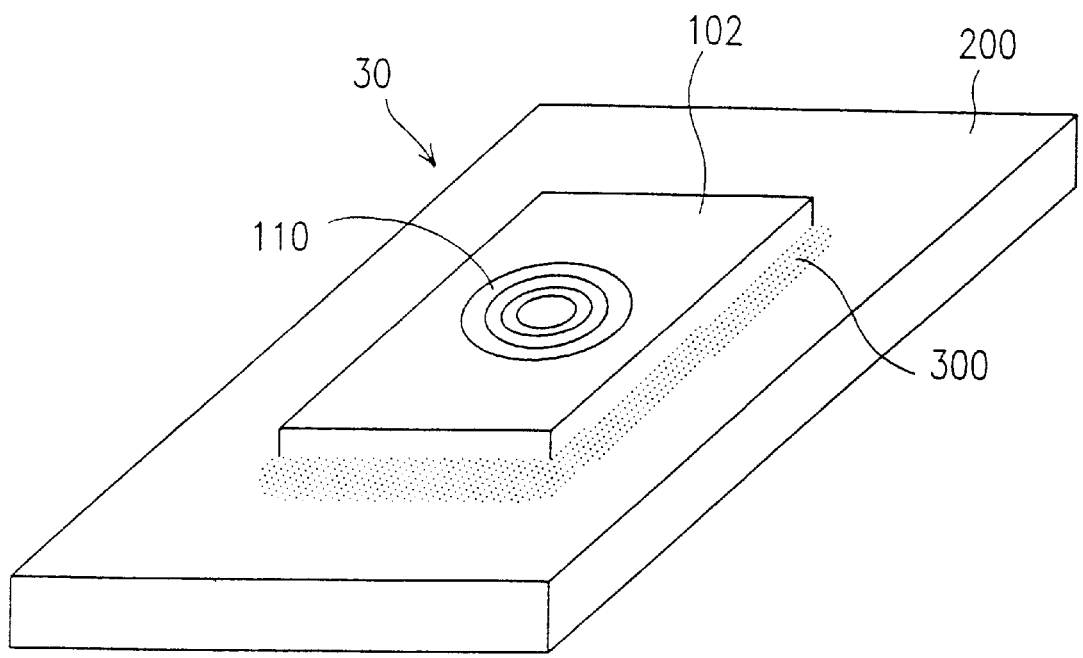
FIG. 8 is a perspective view of a semiconductor device fabricated according to a method in Embodiment 3 of the present invention.

FIG. 8 is a perspective view showing a semiconductor device 30 fabricated according to the method in Embodiment 3 of the present invention.

Embodiment 3 of the present invention is the same as Embodiment 1, except that a Fresnel lens 110 is formed on the GaAs substrate 102, instead of forming the guide holes 106, in the steps shown in FIGS. 4A–4C in Embodiment 1. Specifically, the GaAs substrate 102 is bonded onto the Si submount 200 by the UV curable resin 300. The Fresnel lens 110 is provided on the GaAs substrate 102.

Like components are designated with like reference numerals. Hereinafter, points different from Embodiment 1 will be mainly described, and the description for the components and steps similar to the previously-explained ones will be omitted.

Figure 9:
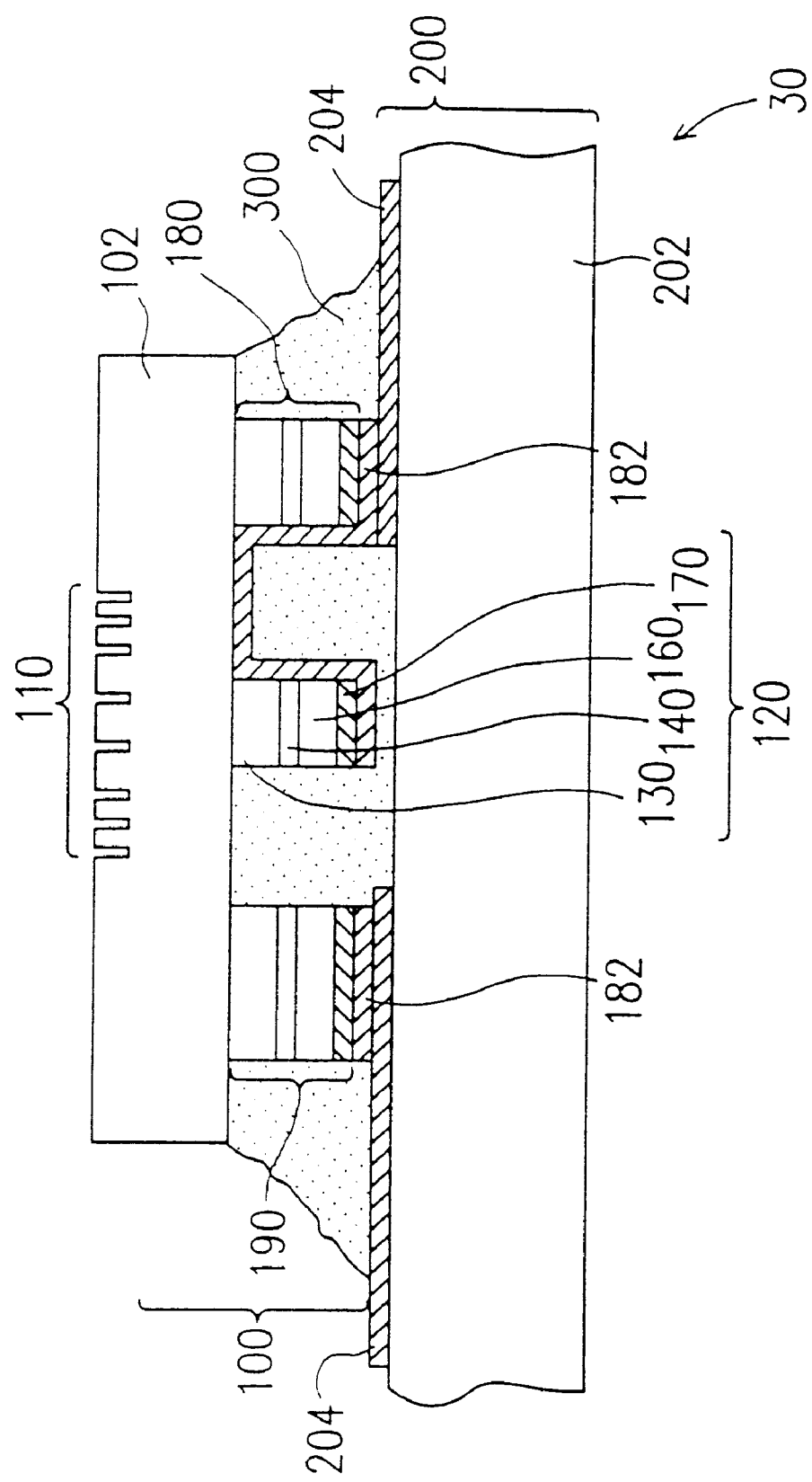
FIG. 9 is a cross-sectional view of the semiconductor device of FIG. 8 fabricated according to the method in Embodiment 3 of the present invention.

FIG. 9 is a cross-sectional view of the semiconductor device 30 fabricated according to the method in Embodiment 3 of the present invention.

The Fresnel lens 110 is provided on the GaAs substrate 102, i.e., on the back surface of the surface emitting laser chip 100, so as to correspond to the center of the surface emitting laser 120. Laser beam output from the surface emitting laser 120 is diffracted by the Fresnel lens 110 so as to be collected at a point (although not shown, referred to as the "light collecting point") located at a desired distance from the GaAs substrate 102. Therefore, when an optical fiber, a photodetector, or the like, is to be deposed at the light collecting point, the output laser beam can be easily coupled to the optical fiber at a high efficiency, or the output laser beam can be easily detected at a high efficiency.

According to Embodiment 3 of the present invention, after etching the back surface of the surface emitting laser chip 100 in the step shown in FIG. 3I described in connection with Embodiment 1, the Fresnel lens 110 is formed.

More specifically, first, polymethylmethacrylate (PMMA) is applied to the surface to which the etching in the step of FIG. 3I is to be performed. Next, the PMMA layer is irradiated with electron beams so as to photo-sensitize the PMMA layer in a pattern corresponding to the configuration of the Fresnel lens 110 to be formed. Thereafter, etching is performed with a mixed solution of saturated bromine solution and alcohol, so as to form grooves constituting the Fresnel lens 110.

Instead of the mixed solution of saturated bromine solution and alcohol used in the above for forming the Fresnel lens 110, other materials (for example: a mixed solution of sulfuric acid, hydrogen peroxide and water; or a mixed solution of ammonia, hydrogen peroxide and water) may be used. Moreover, instead of such wet etching, dry etching using a chlorine type gas may be employed.

Although FIGS. 8 and 9 show only one surface emitting laser chip 100, the semiconductor device 30 can include a plurality of the laser chips 100. In such a case, the production efficiency can be improved by simultaneously treating the large number of semiconductor chips 100, as in Embodiment 1.

Embodiment 4

A method for fabricating a semiconductor device 40 according to Embodiment 4 of the present invention will be described.

FIGS. 10A–10D show some of the steps, which are different from the corresponding steps in Embodiment 1, in the method for fabricating the semiconductor device 40 according to Embodiment 4 of the present invention. Like components are designated with like reference numerals. Hereinafter, points different from Embodiment 1 will be mainly described, and the description for the components and steps similar to the previously-explained ones will be omitted.

First, the steps of FIGS. 3A–3I as explained in connection with Embodiment 1 are performed. In the step of FIG. 3I, unlike that in Embodiment 1, the GaAs substrate 102 in the surface emitting laser chip 100 is etched with a mixed solution of sulfuric acid, hydrogen peroxide and water so as to have a remaining thickness of, about 100 μm.

Figure 10A:
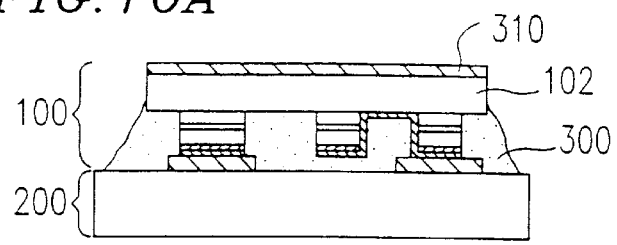
FIGS. 10A–10D are views for illustrating steps in a method for fabricating a semiconductor device according to Embodiment 4 of the present invention.
Figure 10B:
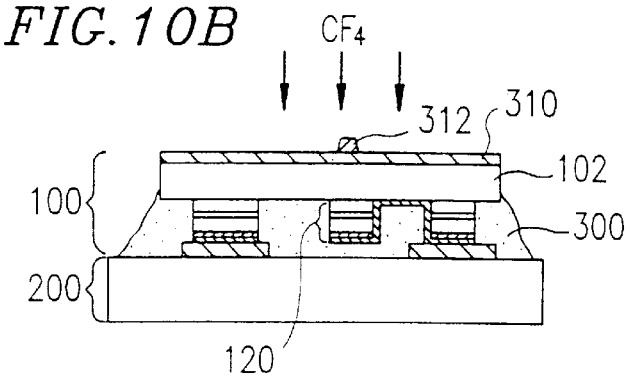

As in Embodiment 1, before performing the subsequent step shown in FIG. 10A, it is preferable to inspect the operational characteristics of the mounted surface emitting laser chip 100.

In the step of FIG. 10A, the SiO$_2$ film 310 is deposited on the back surface of the surface emitting laser chip 100. Then in the step of FIG. 10B, resist 312 is formed and patterned so as to correspond to the center of the surface emitting laser 120. Thereafter, the pattern of the resist 312 is transferred onto the SiO$_2$ film 310 using carbon tetrafluoride (CF$_4$) gas.

Figure 10C:
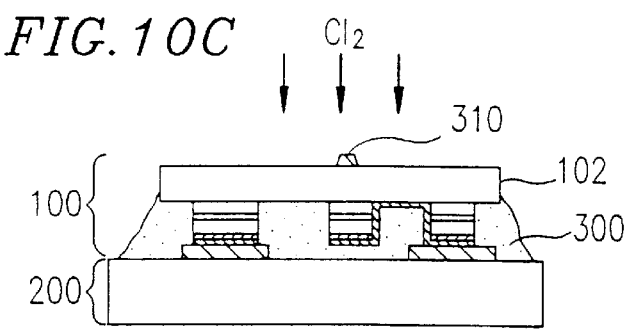
Figure 10D:
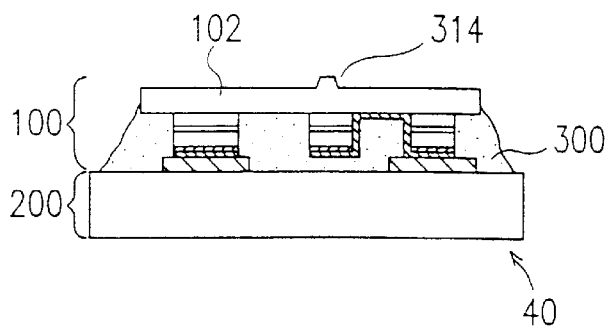

Thereafter, in the step of FIG. 10C, reactive ion etching with chlorine gas is performed using the patterned SiO$_2$ film 310 as a mask so that the GaAs substrate 102 is etched away for about 15 μm. As a result, as shown in FIG. 10D, a protrusion 314 with a height of about 15 μm is ultimately obtained on the back surface of the GaAs substrate 102 after removing the SiO$_2$ film 310. Hereinafter, the protrusion 314 is also referred to as the "back surface protrusion 314".

By using the back surface protrusion 314, coupling between the optical fiber (in which a core thereof is previously removed by 15 μm from the cut surface) and the surface emitting laser chip 100 can be realized with high accuracy and without performing alignment. The back surface protrusion 314 preferably has a shape of a truncated cone, which enables the optical fiber to be easily and accurately guided to a desired position in the surface emitting laser chip 100.

Although only one back surface protrusion 314 is formed for one surface emitting laser chip 100 in the above, a plurality of the back surface protrusions may be provided for one surface emitting laser chip 100.

Embodiment 5

A method for fabricating a semiconductor device 50 according to Embodiment 5 of the present invention will be described.

FIGS. 11A–11I and 12A–12C show steps of the method for fabricating the semiconductor device 50 according to Embodiment 5 of the present invention. The steps shown in FIGS. 11A–11I respectively correspond to the steps shown in FIGS. 3A–3I described previously in connection with Embodiment 1. Like components are designated with like reference numerals. Thus, points different from Embodiment 1 will be mainly described hereinafter, and the description for the components and steps similar to the previously-explained ones will be omitted.

First, in the step of FIG. 11A, a photodiode 320 is formed on the Si substrate 202. In the step of FIG. 11C, the UV curable resin 300 is applied onto the Si substrate 202 so as to cover the photodiode 320.

The steps shown in FIGS. 11B–11I are performed in the same manner as in the steps shown in FIGS. 3B–3I, except for the step in FIG. 11I, in which the GaAs substrate 102 of the surface emitting laser chip 100 is etched away to reach the etching stop layer 104 using a mixed solution of sulfuric acid, hydrogen peroxide and water.

As in Embodiment 1, before performing the subsequent step, it is preferable to inspect the operational characteristics of the mounted surface emitting laser chip 100.

Figure 12A:
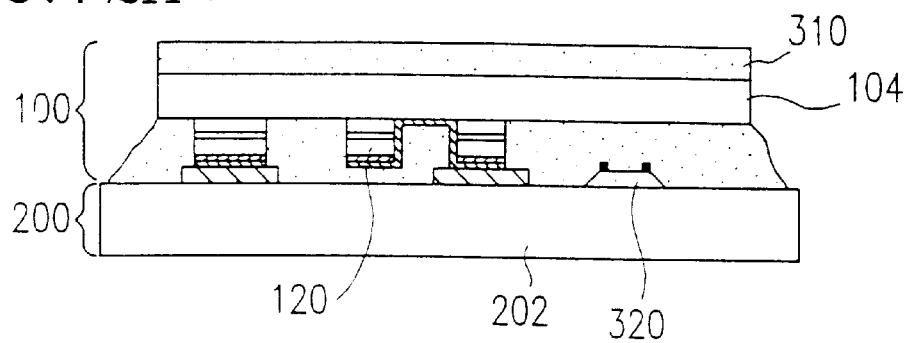
FIGS. 12A–12C are views for illustrating steps in the method for fabricating a semiconductor device according to Embodiment 5 of the present invention.

Referring to the step of FIG. 12A, the SiO$_2$ film 310 is deposited on the back surface of the surface emitting laser chip 100. Then, in the step of FIG. 12B, resist 322 is patterned while side walls of the resist 322 are patterned so as to have a slope of about 45° (i.e., to be processed into the "edged surface"). Next, with dry etching using carbon tetrafluoride gas, the pattern of the resist 322 is transferred onto the SiO$_2$ film 310 so as to form an optical wave guide 324. A thickness of the optical wave guide 324, i.e., a thickness of the SiO$_2$ film 310 is preferably in the range of about 0.01 μm to about 10 μm. A width of the optical wave guide 324 is preferably in the range of about 3 μm to about 50 μm.

The optical wave guide 324 may be formed of the SiO$_2$ film, but is not limited thereto. Any material having a refractive index greater than that of the GaAs substrate 104 and being capable of easily guiding laser beam may be used. For example, polyimide may be used as an organic material, and AlGaAs may be employed as a semiconductor material.

Figure 12B:
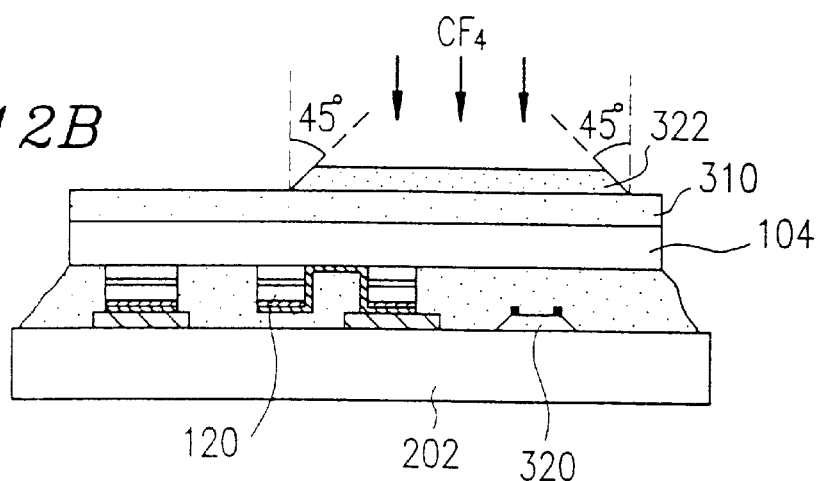
Figure 12C:
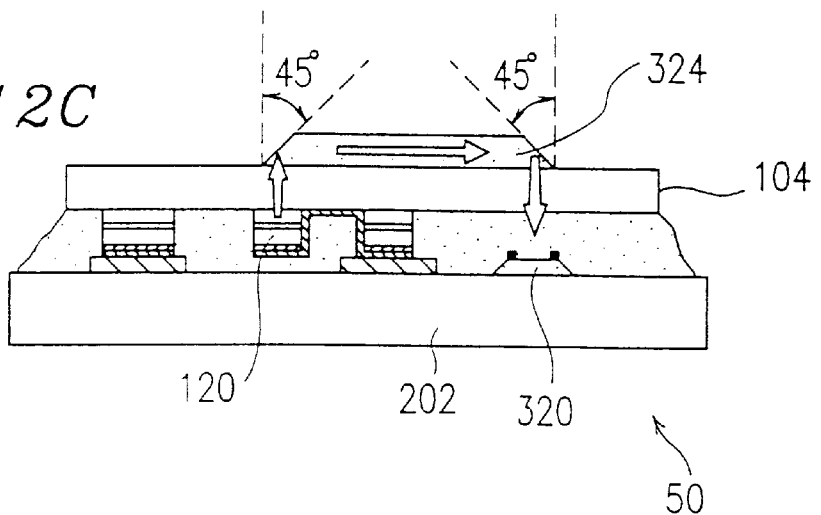

Since the edged surfaces of the resist 322 each have a slope of about 450 as shown in FIG. 12B, the edged surfaces of the optical wave guide 324 also have a slope of about 45° after the completion of the dry etching process using carbon tetrafluoride gas as shown in FIG. 12C. One of the edged surfaces of the optical wave guide 324 with a slope of about 45° faces the surface emitting laser 120, and the other edged surface faces the photodiode 320.

The optical wave guide 324 is formed on the back surface of the surface emitting laser chip 100 so as to face the surface emitting laser 120. As a result, the optical wave guide 324 allows the light emitted from the surface emitting laser 120 to guide therethrough and be incident onto the photodiode 320. Specifically, the laser beam output from the surface emitting laser 120 transmits through the etching stop layer 104 and is incident on the edged surface of the optical wave guide 324. Since the edged surface has a slope of about 45°, part of the beam is reflected thereon so as to be guided through the optical wave guide 324, while the remaining part of the beam is output to the outside. The guided laser beam reaches the other edged surface of the optical wave guide 324 so that part of the guided beam is reflected again and is incident on the photodiode 320. By obtaining a signal from the photodiode 320 through the Si submount 200 to realize a feedback control for the surface emitting laser 120, it becomes possible to control the intensity of the laser beam output from the surface emitting laser 120 so as to be maintained at a constant level.

According to the present embodiment, the angle made by the edged surfaces of the resist 322 and the optical wave guide 324 is about 450. Alternatively, any different angle except for 90° may be used, since it is only necessary for part of the laser beam output from the surface emitting laser to be reflected at the edged surface of the optical wave guide 324 and propagated through the optical wave guide 324. It should be noted, however, an angle of the edged surface of the optical waveguide 324 is preferably in the range of about 30° to about 70°.

Although it is illustrated that one photodiode 320 receives only the laser beam emitted from one surface emitting laser 120 in the above explanation, the present invention is not limited thereto. For example, if the optical wave guide is provided such that one photodiode receives the laser beams respectively emitted from a plurality of surface emitting lasers, the laser beam output from the plurality of the surface emitting lasers can be detected as a whole at the photodiode.

Embodiment 6

A method for fabricating a semiconductor device 60 according to Example 6 of the present invention will be described.

FIGS. 13A–13J show steps of the method for fabricating the semiconductor device 60 according to Embodiment 6 of the present invention. Like components are designated with like reference numerals. Thus, points different from Embodiment 1 will be mainly described hereinafter, and the description for the components and steps similar to the previously-explained ones will be omitted.

First, the steps shown in FIGS. 13A–13I are performed. These steps respectively correspond to the steps of FIGS. 3A–3I previously described in connection with Embodiment 1, except that the etching stop layer 104, provided on the GaAs substrate 102 in Embodiment 1, is not formed; and the step shown in FIG. 13J is additionally performed.

In the case where the laser beam is not significantly absorbed or scattered by the GaAs substrate 102, it is not necessary to completely remove the GaAs substrate 102. Rather, it is sufficient to perform the etching for removing the GaAs substrate 102 by controlling the etching time so as to leave about 1/10 of the original thickness of the GaAs substrate 102, without providing the etching stop layer 104.

Figure 13A:
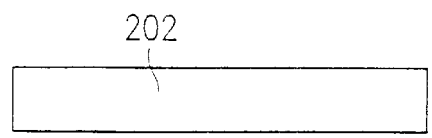
FIGS. 13A–13J are views for illustrating steps in a method for fabricating a semiconductor device according to Embodiment 6 of the present invention.
Figure 13B:
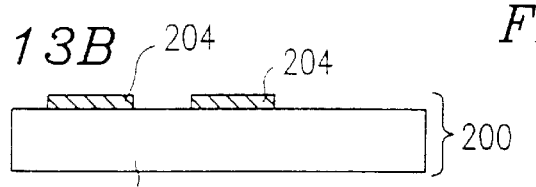
Figure 13C:
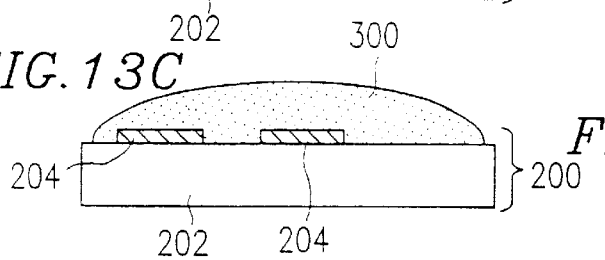
Figure 13D:
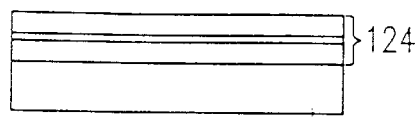
Figure 13E:
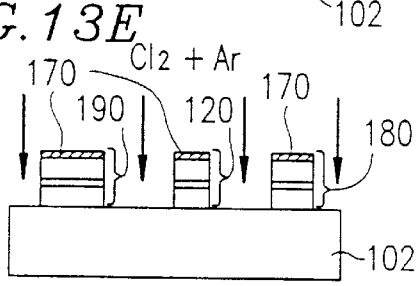
Figure 13F:
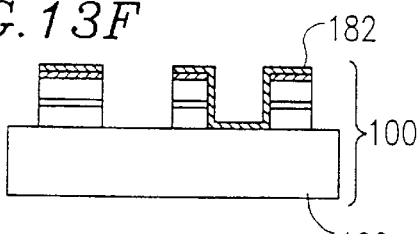
Figure 13G:
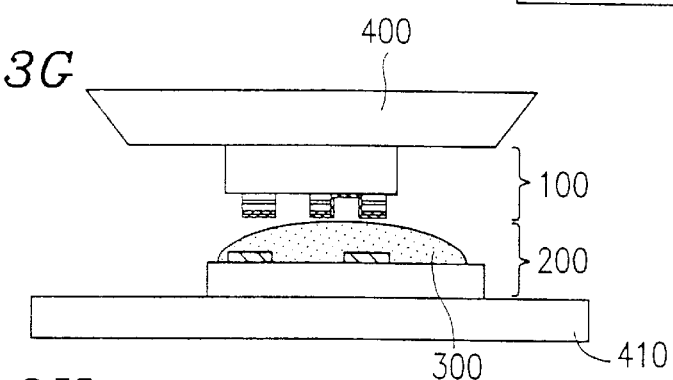
Figure 13H:
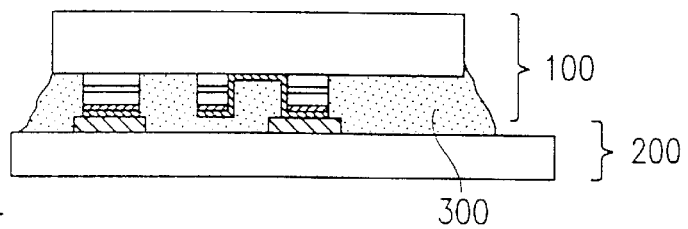
Figure 13I:
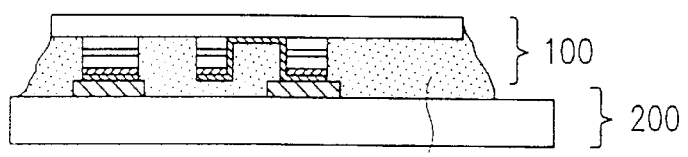
Figure 13J:
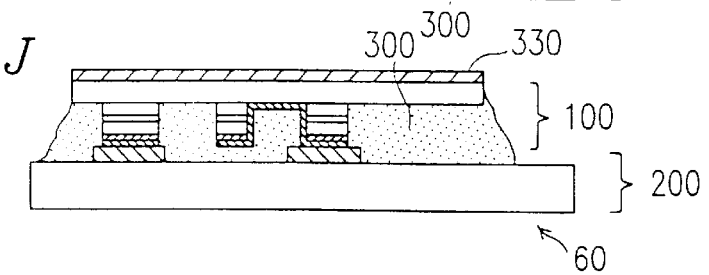

Furthermore, in the step of FIG. 13J, an antireflection film 330 is deposited on the back surface of the surface emitting laser chip 100.

According to the present embodiment, the antireflection film 330 is formed on the back surface of the surface emitting laser chip 100 which functions as an output surface (an emission portion) for the laser beam. Thus, the light reflection is suppressed at the back surface of the substrate, thereby being capable of efficiently emitting the laser beam. In addition, the amount of the laser beam which returns to the active layer is reduced, thereby eliminating the adverse effects caused by the returned light noise and an external cavity mode to be generated between the Bragg reflector and the back surface of the substrate.

Embodiment 7

Figure 14:
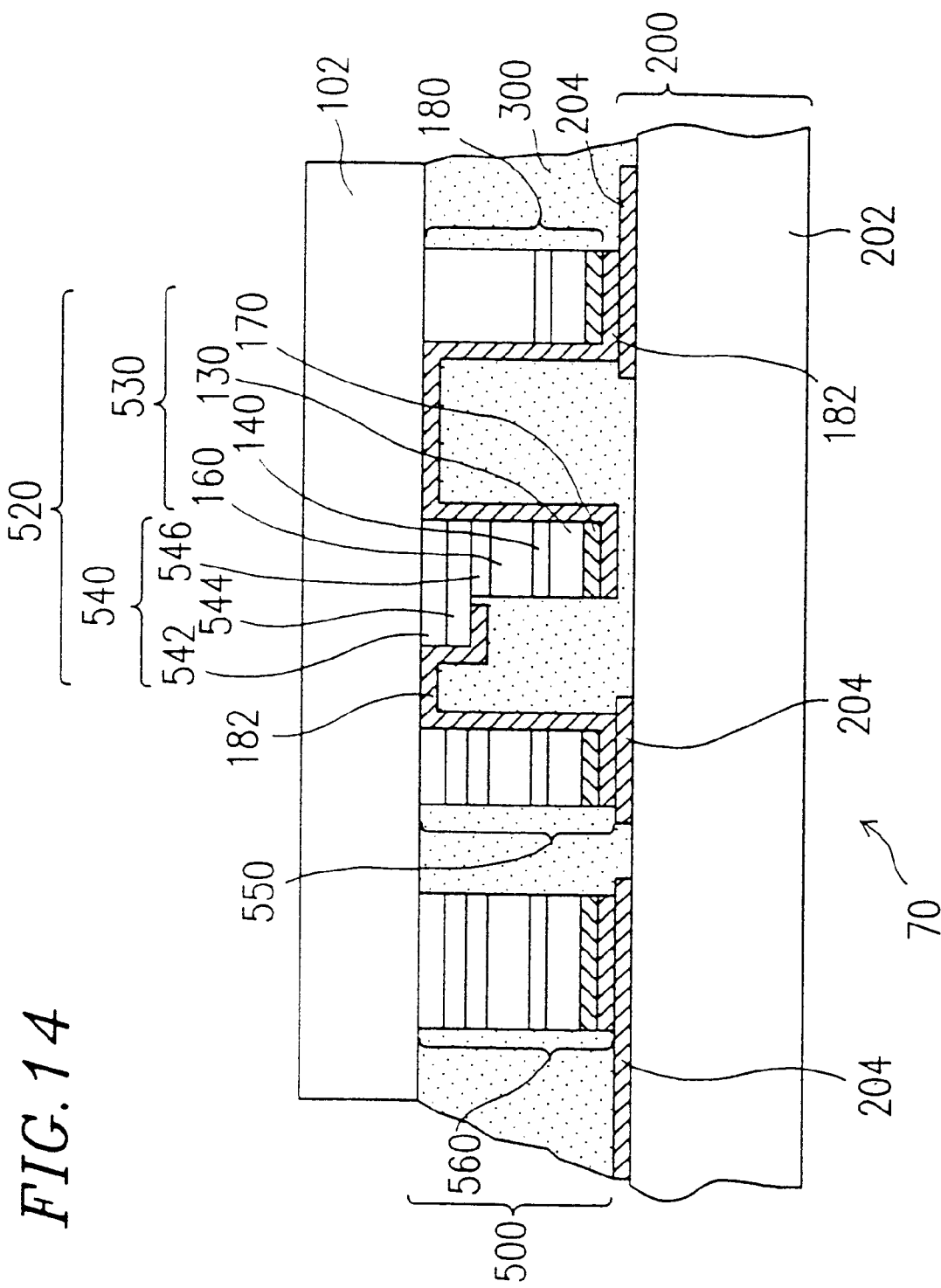
FIG. 14 is a cross-sectional view showing one of surface emitting laser chips included in a semiconductor device fabricated according to a method in Embodiment 7 of the present invention.

FIG. 14 is a cross-sectional view showing one of surface emitting laser chips 100 included in a semiconductor device 70 fabricated according to the method in Embodiment 7 of the present invention. Among the constituting elements of the semiconductor device 70, elements different from those in Embodiment 1 will be mainly described hereinafter. Like elements are designated with like reference numerals, and the description therefor will be omitted.

The semiconductor device 70 includes a SEL/HBT chip 500 provided on the Si submount 200. The SEL/HBT chip 500 includes a surface emitting laser 530 and a heterojunction bipolar transistor 540 provided on the same GaAs substrate 102.

An emitter 542, a base 544, and a collector 546 of the heterojunction bipolar transistor 540 are provided in this order on the GaAs substrate 102. On the collector 546, the n-type Bragg reflector 160, the active layer 140, the p-type Bragg reflector 130, and the electrode 170 of the surface emitting laser 530 are provided in this order. The collector 546 of the heterojunction bipolar transistor 540 is electrically connected to the n-type Bragg reflector 160 of the surface emitting laser 530. As a result, an electric signal input to the base 544 of the heterojunction bipolar transistor 540 is amplified by the heterojunction bipolar transistor 540 and then supplied to the surface emitting laser 530. Thus, the semiconductor device 70 can perform the amplification of the input electric signal in addition to the output of the laser beam.

The microbump 180, a base microbump 550, and a common cathode microbump 560 are formed on the GaAs substrate 102 such that a SEL/HBT chip 520 does not contact the Si submount 200 upon performing the flip chip mounting. The electrode 170 and the microbump 180, as well as the base 544 and the base microbump 550, are electrically connected to each other by the Ti/Au wirings 182. The GaAs substrate 102 is etched away so as to have a remaining thickness of about 100 μm.

FIGS. 15A–15I show steps of the method for fabricating a semiconductor device according to Embodiment 7 of the present invention. Hereinafter, points different from Embodiment 1 will be mainly described. The description for the steps similar to the previously-explained steps will be omitted.

The steps shown in FIGS. 15A–15I respectively correspond to the steps in FIGS. 3A–3I previously described in connection with Embodiment 1, except that the etching stop layer 104 provided on the GaAs substrate 102 in Embodiment 1 is not formed.

Figure 15A:
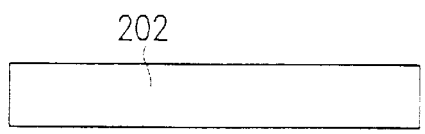
FIGS. 15A–15I are views for illustrating steps in the method for fabricating a semiconductor device according to Embodiment 7 of the present invention.
Figure 15B:
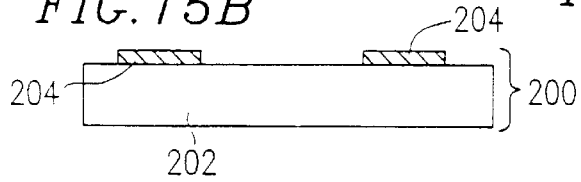
Figure 15C:
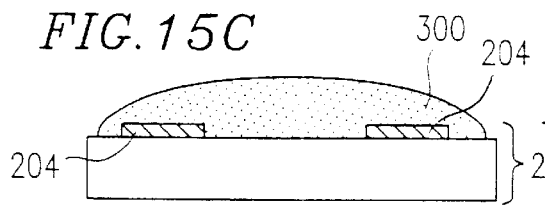
Figure 15D:
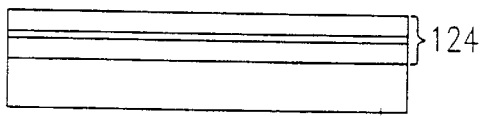
Figure 15E:
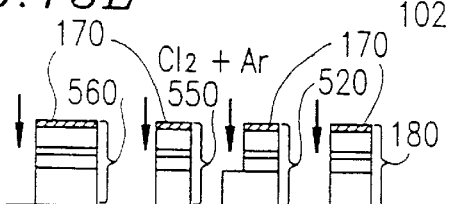
Figure 15F:
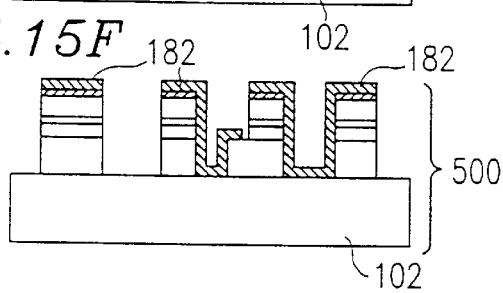
Figure 15G:
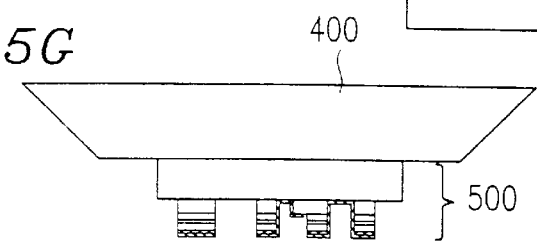
Figure 15H:
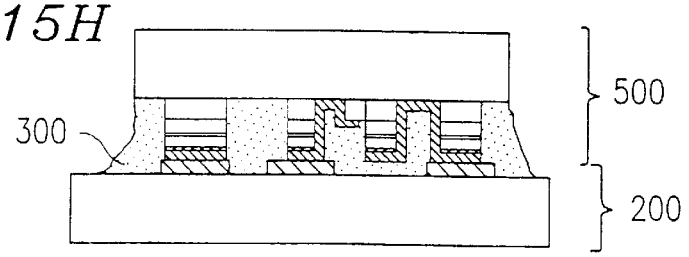
Figure 15I:
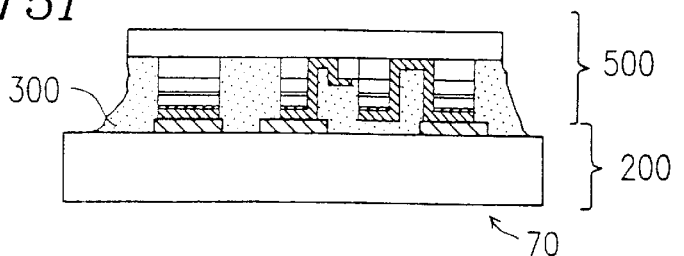

Furthermore, in the step of FIG. 15E, the microbump 180, the SEL/HBT 520, the base microbump 550, and the common cathode microbump 560 are formed on the GaAs substrate 102, and the electrode 170 is further formed thereon. The GaAs substrate 102 is etched away in the step of FIG. 15I, but in a different manner from Embodiment 1, so as to have a remaining thickness of about 100 μm. With such a reduced remaining thickness of the GaAs substrate 102, the adverse effects typically caused by the scattering and absorption of the output laser beam in the GaAs substrate 102 can be reduced. As a result, the laser beam can be emitted at a high efficiency.

Embodiment 8

A method for fabricating a semiconductor device 80 according to Embodiment 8 of the invention will be described. FIGS. 16A–16G and 17A–17I show steps of the method for fabricating the semiconductor device 80 according to Embodiment 8 of the present invention.

Embodiment 8 differs from Embodiment 1 in that electrical connection is achieved by a microbump employing gold (Au) instead of the microbump employing Bi in Embodiment 2; and a film is deposited on the back surface of a surface emitting laser chip using atomic layer junction technique after the mounting of the chip.

Specifically, in the step of FIG. 16A, pre-treatment is performed for a Si substrate 1601 in which the Si substrate 1601 is, for example, washed with organic solvent such as acetone. Then, in the step of FIG. 16B, a wiring 1602 typically having a layered structure including an Au layer is formed in a desired pattern on the Si substrate 1601, thereby completing a Si submount 1603.

On the other hand, in the step of FIG. 16C, an n-type Bragg reflector 1605 is grown on a GaAs substrate 1604 using a molecular beam epitaxy (MBE) method or a metal organic vapor phase epitaxy (MOVPE) method. As described in Embodiment 1, the n-type Bragg reflector 1605 has the n-type conductivity, and is formed of a plurality of layers which are made of two kinds of materials having different refractive indexes.

Then, in the step of FIG. 16D, a Au bump 1606 is formed on the n-type Bragg reflector 1605. Thereafter, the n-type Bragg reflector 1605 and the Au bump 1606 are etched away by dry etching with a mixed gas of chlorine and argon using the Au bump 1606 as a mask, so as to reach the GaAs substrate 1604.

In the step of FIG. 16E, the Si submount 1603 and the GaAs substrate 1604 are mounted. Alignment therebetween is performed while the Si submount 1603 is fixed onto an adsorption seating 1608 so as to face the GaAs substrate 1604 with the back surface thereof being vacuum-adsorbed onto an adsorption tool 1607.

After performing the alignment in the step of FIG. 16E, the wiring 1602 and the Au bump 1606 are electrically connected to each other by the application of pressure in the step of FIG. 16F. Specifically, the Si submount 1603 and the GaAs substrate 1604 are heated to a temperature of about 400° C. or greater while being applied with the pressure, so as to form a Au-Au junction between the wiring 1602 and the Au bump 1606. Alternatively, a bump using different metal other than Au may be employed to realize the electrical connection between the wiring 1602 and the bump 1606.

As shown in FIG. 16F, in order to protect the n-type Bragg reflector 1605, resist 1609 is injected between the n-type Bragg reflector 1605 and the Si substrate 1601 of the Si submount 1603, and then cured.

Figure 17A:
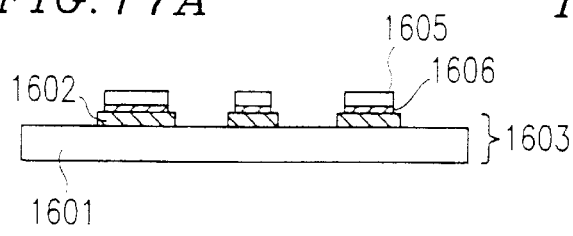
FIGS. 17A–17I are views for illustrating steps in the method for fabricating a semiconductor device according to Embodiment 8 of the present invention.

Then in the step of FIG. 16G, the GaAs substrate 1604 is removed with a mixed solution of sulfuric acid, hydrogen peroxide and water. After further removing an oxide film on the back surface of the n-type Bragg reflector 1605 with hydrofluoric acid, the resist 1609 is removed. FIG. 17A shows the state after the step in FIG. 16G is completed.

Figure 17B:
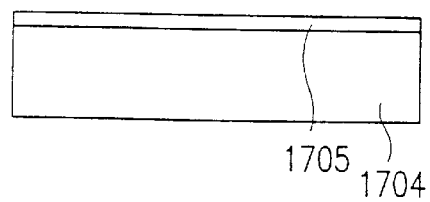

On the other hand, in the step shown in FIG. 17B, an InGaAsP active layer 1705 is grown on an InP substrate 1704 using MOVPE method.

Figure 17C:
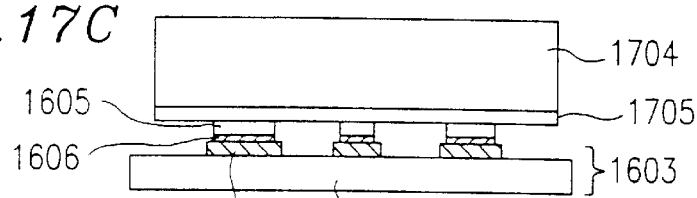

Thereafter, as shown in FIG. 17C, the Si submount 1603 (on which the n-type Bragg reflector 1605 is mounted via the Au bump 1606) and the InP substrate 1704 (on which the InGaAsP active layer 1705 is grown) are disposed so as to face each other, and then made closely contacted to each other. At this time, about several hundred grams of molybdenum (not shown) are put on the back surface of the InP substrate 1704 as a weight. While maintaining such a state, heating is performed at a temperature of about 500° C. or greater in a reducing atmosphere so as to realize the atomic layer bonding between the n-type Bragg reflector 1605 and the InGaAsP active layer 1705.

Figure 17D:
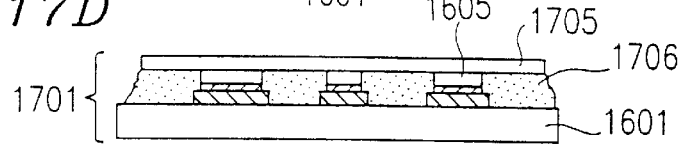
Figure 17E:
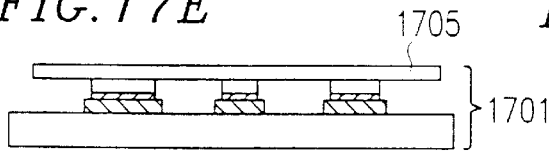

Then, in the step shown in FIG. 17D, in order to protect the n-type Bragg reflector 1605, resist 1706 is injected between the Si substrate 1601 and the InGaAsP active layer 1705, and then cured. The InP substrate 1704 is then removed with a mixed solution of hydrochloric acid and phosphoric acid to obtain a bonded submount 1701. Furthermore, in the step shown in FIG. 17E, after removing an oxide film generated on the back surface of the InGaAs active layer 1705 with hydrofluoric acid, the resist 1706 is removed.

Figure 17F:
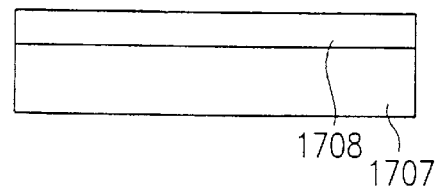

On the other hand, in the step shown in FIG. 17F, a p-type Bragg reflector 1708 is grown on a GaAs substrate 1707 using MBE method or MOVPE method.

Figure 17G:
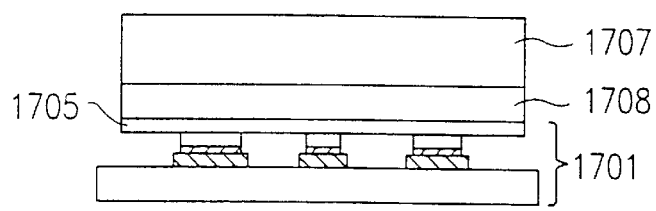

Thereafter, as shown in FIG. 17G, similarly in the step of FIG. 17C, the bonded submount 1701 (on which the InGaAsP active layer 1705 and the n-type Bragg reflector 1605 are mounted) and the GaAs substrate 1707 are disposed so as to face each other,. and made closely contacted to each other. At this time, about several hundred grams of molybdenum (not shown) are again put on the back surface of the GaAs substrate 1707 as a weight. While maintaining such a state, heating is performed at a temperature of about 500° C or greater in a reducing atmosphere so as to realize the atomic layer bonding between the InGaAsP active layer 1705 and the p-type Bragg reflector 1708.

Figure 17H:
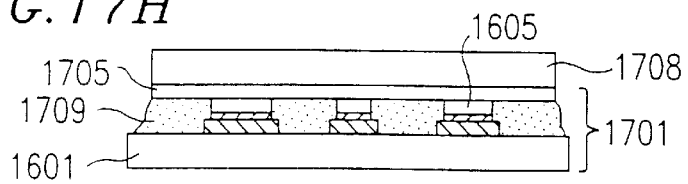
Figure 17I:
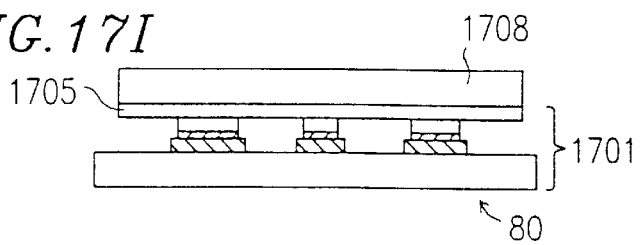
Figure 18A:
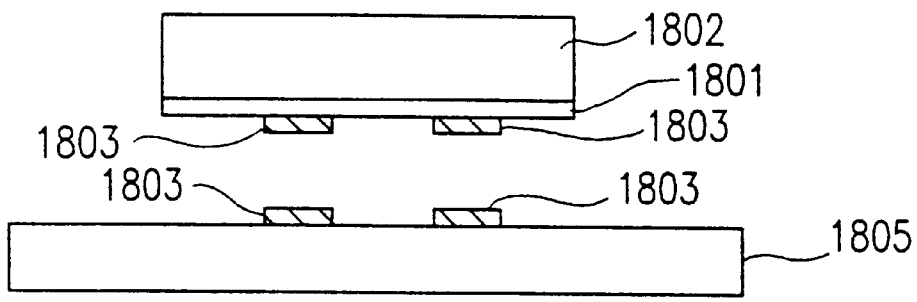
FIGS. 18A–18D are cross-sectional views showing steps of a conventional method for fabricating a semiconductor device.
Figure 18B:
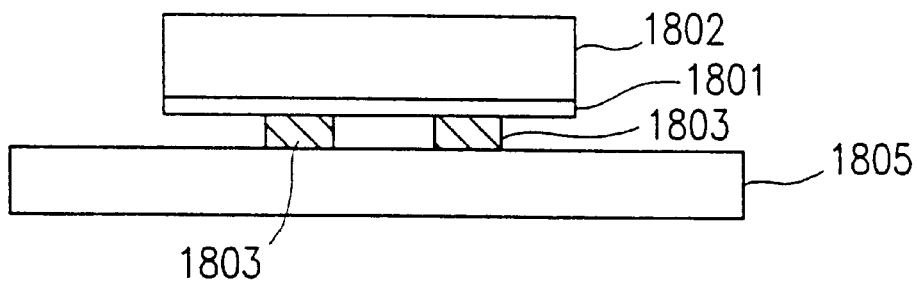
Figure 18C:
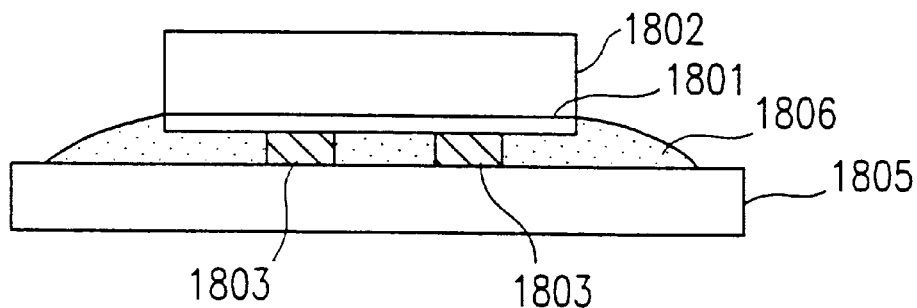
Figure 18D:
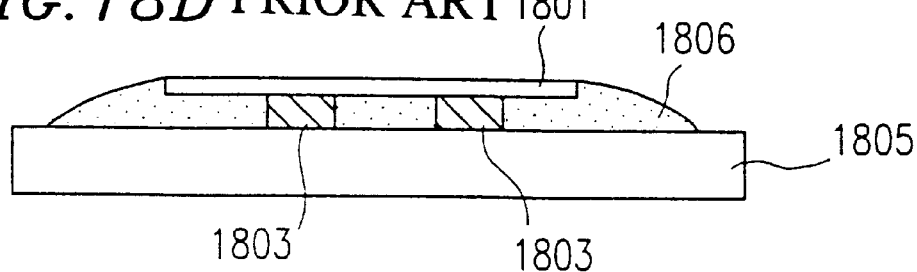

Then, in the step shown in FIG. 17H, in order to protect the n-type Bragg reflector 1605, resist 1709 is injected between the Si substrate 1601 and the InGaAsP active layer 1705 of the bonded submount 1701, and then cured. Then, the GaAs substrate 1707 is etched away with a mixed solution of sulfuric acid, hydrogen peroxide, and water so as to have a remaining thickness of about 100 μm or less. After further removing the: resist 1709, the semiconductor device 80 is obtained as shown in FIG. 17I.

By using the atomic layer bonding technique in the above-described manner, it is possible to fabricate a surface emitting laser for optical communication which is structured by a Bragg reflector with a high reflectivity. Thus, a surface emitting laser for optical communication with a reduced threshold current can be realized. In addition, the application of the atomic layer bonding technique to the method for fabricating a semiconductor device according to the present invention makes it possible to fabricate a surface emitting laser which can be simultaneously produced in a greater number and has less variation in characteristics, as compared to the case where a single surface emitting laser is fabricated using the atomic layer junction technique.

In Embodiment 8 of the present invention, a semiconductor device other than the surface emitting laser, for example, a photodetector for measuring and controlling the intensity of laser beam, may be formed on the back surface of the semiconductor :chip by the atomic layer bonding technique. Thus, the surface emitting laser and the photodetector for controlling laser beam intensity, for example, can be integrated so as to be formed on the same submount. Moreover, although InGaAsP is used for the active layer of the surface emitting laser in the present embodiment, other semiconductor material such as InGaAs, GaInNAs, and InGaN may be i employed.

It should be noted that although the present invention is described in the context of the combination of the surface emitting laser and the Si submount in each of the above-described embodiments, another electronic device such as a field effect transistor, heterojunction bipolar transistor, HEMT, and MOS transistor may be mounted on the Si submount. The material for the submount is not limited to silicon (Si). For example, glass or aluminum nitride (AlN) may be used. Furthermore, the specific conditions, such as a deposited film thickness, are described for illustrative purpose only, and the present invention is not limited thereto.

According to the present invention, after a plurality of semiconductor chips are mounted on the same submount, one or more certain processing steps (i.e., the film. formation process, the etching process, the patterning process, or the washing process) are simultaneously performed for the back surfaces of !the semiconductor chips. Thus, the back surfaces of the large number of the semiconductor chips can be simultaneously processed. Consequently, the large number of the semiconductor chips are processed in the same step. Thus, it is possible to realize uniformity of the characteristics of the individual semiconductor chips and cost reduction in the back surface treatment for the semiconductor chip.

According to the conventional technique, it is difficult to mount a semiconductor chip onto a submount after the back surface thereof is processed. According to the present invention, on the other hand, it is easily realized to mount a semiconductor chip onto a submount after the back surface thereof is processed. The above-described feature is especially advantageous when the submount is far larger than the size of the semiconductor chip.

Various other modifications will be apparent to and can be readily made by those skilled in the art without departing from the scope and spirit of this invention. Accordingly, it is not intended that the scope of the claims appended hereto :be limited to the description as set forth herein, but rather that the claims be broadly construed.

What is claimed is:

1. A method for fabricating a semiconductor device in which a semiconductor chip having a first surface and a second surface substantially parallel to each other is mounted on a submount such that the first surface faces the submount, comprising:

a first step of applying resin to at least one of the first surface of the semiconductor chip and the submount;

after the first step, a second step of applying a pressure to the semiconductor chip and the submount so that the first surface of the semiconductor chip and the submount are bonded to each other by the resin, resulting in electrical connection therebetween;

after the second step, a third step of etching the second surface of the semiconductor chip; and a fourth step of forming a Fresnel lens on the second surface of the semiconductor chip.

2. A method for fabricating a semiconductor device according to claim 1, wherein a step of inspecting operational characteristics of the semiconductor chip is further performed between the second step and the third step.

3. A method for fabricating a semiconductor device according to claim 1, wherein another semiconductor element is formed-on the second surface of the semiconductor chip in the third step.

4. A method for fabricating a semiconductor device according to claim 1, further comprising a step of disposing a plurality of the semiconductor chips on the submount substantially at the same time.

5. A method for fabricating a semiconductor device according to claim 1, wherein:

a) during the third step the second surface of the semiconductor chip is etched to a thickness of about 100 $\mu$m; and b) said method further comprises the step of performing at least one of a film formation process, a patterning process, and a washing process for the second surface of the semiconductor chip, wherein a film is formed over an opposed semiconductor chip surface.

* * * * *